(12) United States Patent
Shinomiya et al.

(10) Patent No.: US 8,024,689 B2
(45) Date of Patent: Sep. 20, 2011

(54) SEMICONDUCTOR INTEGRATED CIRCUIT APPARATUS WITH LOW WIRING RESISTANCE

(75) Inventors: Noriko Shinomiya, Osaka (JP); Kiyohito Mukai, Kyoto (JP)

(73) Assignee: Panasonic Corporation, Osaka (JP)

( * ) Notice: Subject to any disclaimer, the term of this patent is extended or adjusted under 35 U.S.C. 154(b) by 1106 days.

(21) Appl. No.: 11/798,678

(22) Filed: May 16, 2007

(65) Prior Publication Data

US 2007/0272949 A1 Nov. 29, 2007

(30) Foreign Application Priority Data

May 16, 2006 (JP) .............................. P. 2006-136455
May 9, 2007 (JP) .............................. P. 2007-124784

(51) Int. Cl.
*G06F 17/50* (2006.01)
*H01L 27/118* (2006.01)
*H01L 23/58* (2006.01)
*H01L 23/48* (2006.01)
*H01L 23/52* (2006.01)
*H01L 29/40* (2006.01)

(52) U.S. Cl. ........ 716/126; 257/208; 257/210; 257/211; 257/635; 257/758

(58) Field of Classification Search ................. 716/8–14, 716/119, 126; 257/635, 758, 208, 210, 211
See application file for complete search history.

(56) References Cited

U.S. PATENT DOCUMENTS

| 5,293,503 | A | 3/1994 | Nishigoori |
| 6,253,362 | B1 | 6/2001 | Anand et al. |
| 6,305,000 | B1 | 10/2001 | Phan et al. |
| 6,487,712 | B1 | 11/2002 | Kim |
| 2004/0083438 | A1 | 4/2004 | Ohba et al. |
| 2004/0088669 | A1 * | 5/2004 | Loh et al. .......................... 716/13 |
| 2004/0155316 | A1 * | 8/2004 | Saito et al. ..................... 257/536 |
| 2005/0167842 | A1 * | 8/2005 | Nakamura et al. ............. 257/758 |
| 2006/0168551 | A1 * | 7/2006 | Mukuno ............................. 716/5 |
| 2006/0203531 | A1 * | 9/2006 | Tamura et al. .................. 365/63 |

FOREIGN PATENT DOCUMENTS

| JP | 3-3255 | 1/1991 |
| JP | 5-63085 | 3/1993 |
| JP | 3137072 | 11/1999 |
| JP | 2001-34646 | 2/2001 |
| JP | 2005-222214 | 8/2005 |

* cited by examiner

*Primary Examiner* — Suresh Memula
(74) *Attorney, Agent, or Firm* — McDermott Will & Emery LLP

(57) ABSTRACT

It is an object to provide a semiconductor integrated circuit which can easily be designed and has a low wiring resistance, and a method and apparatus for designing the semiconductor integrated circuit.

In a semiconductor integrated circuit apparatus according to the invention, a first wiring layer is provided with a plurality of signal wirings having an equal width which is disposed in parallel with each other at a regular interval, and at least two of the signal wirings which are adjacent to each other are electrically connected to each other.

17 Claims, 32 Drawing Sheets

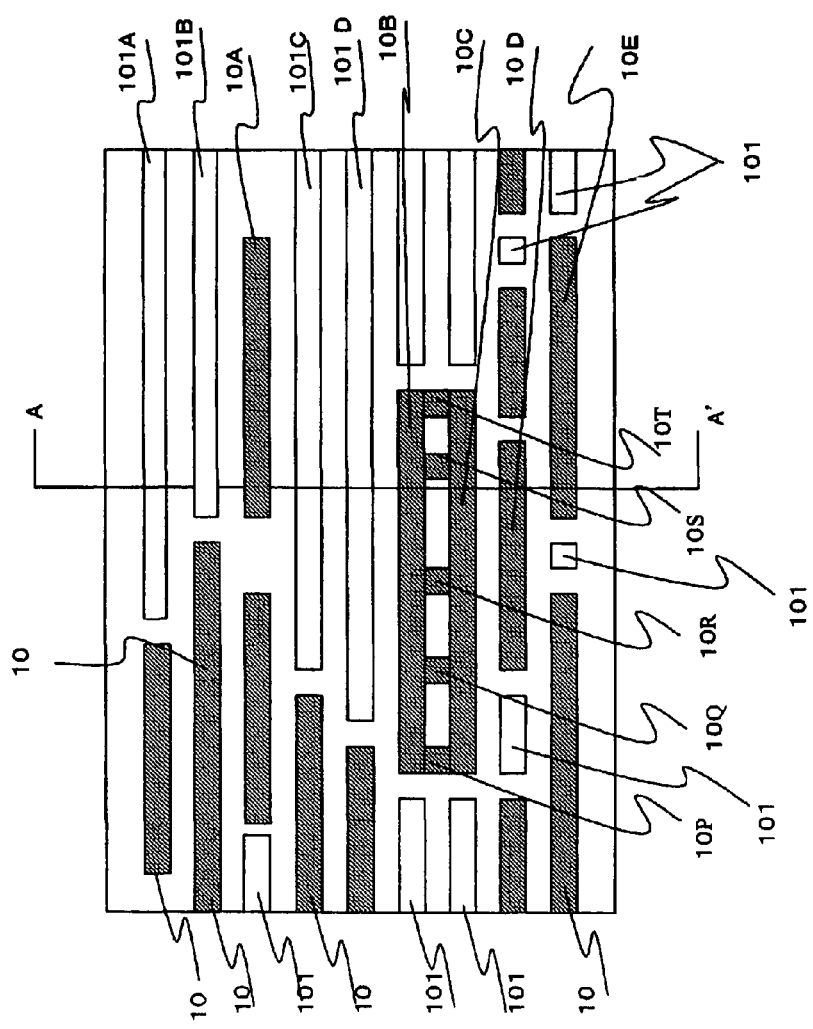
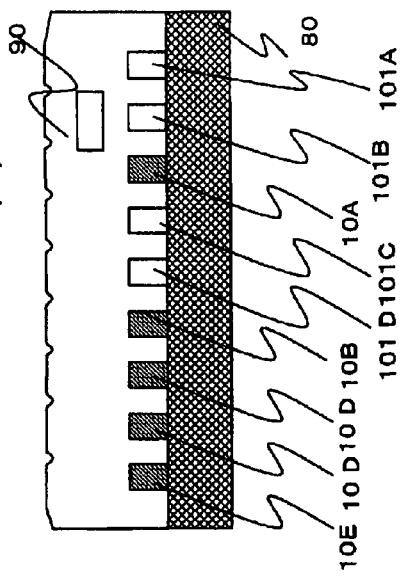
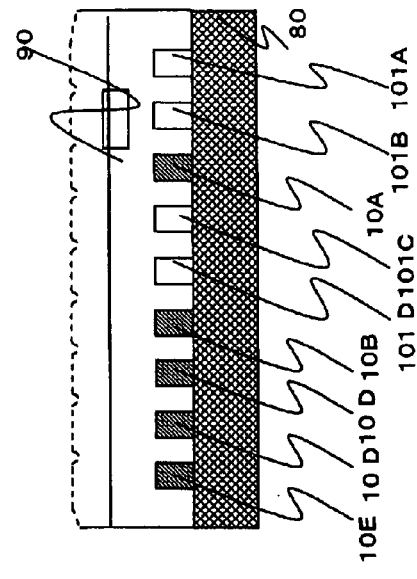
FIG. 20(a)
FIG. 20(b)
FIG. 20(c)

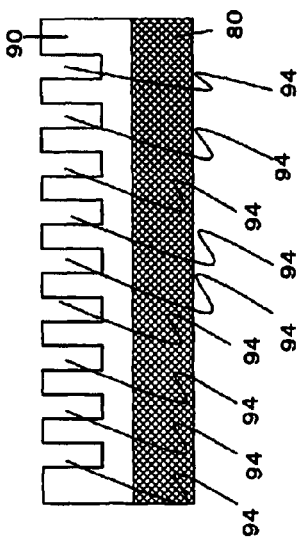
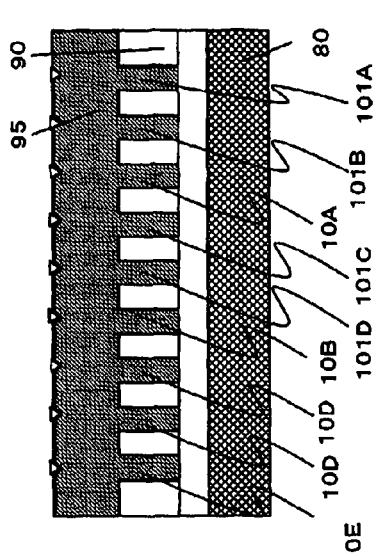
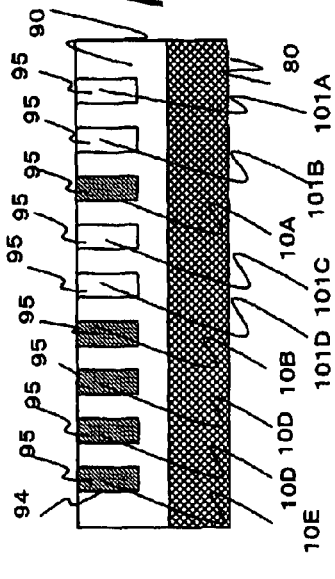
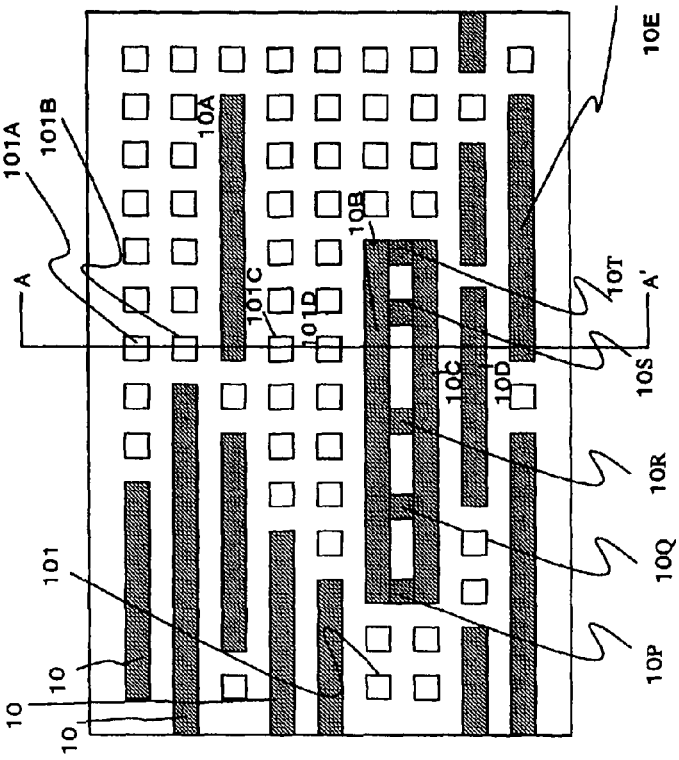

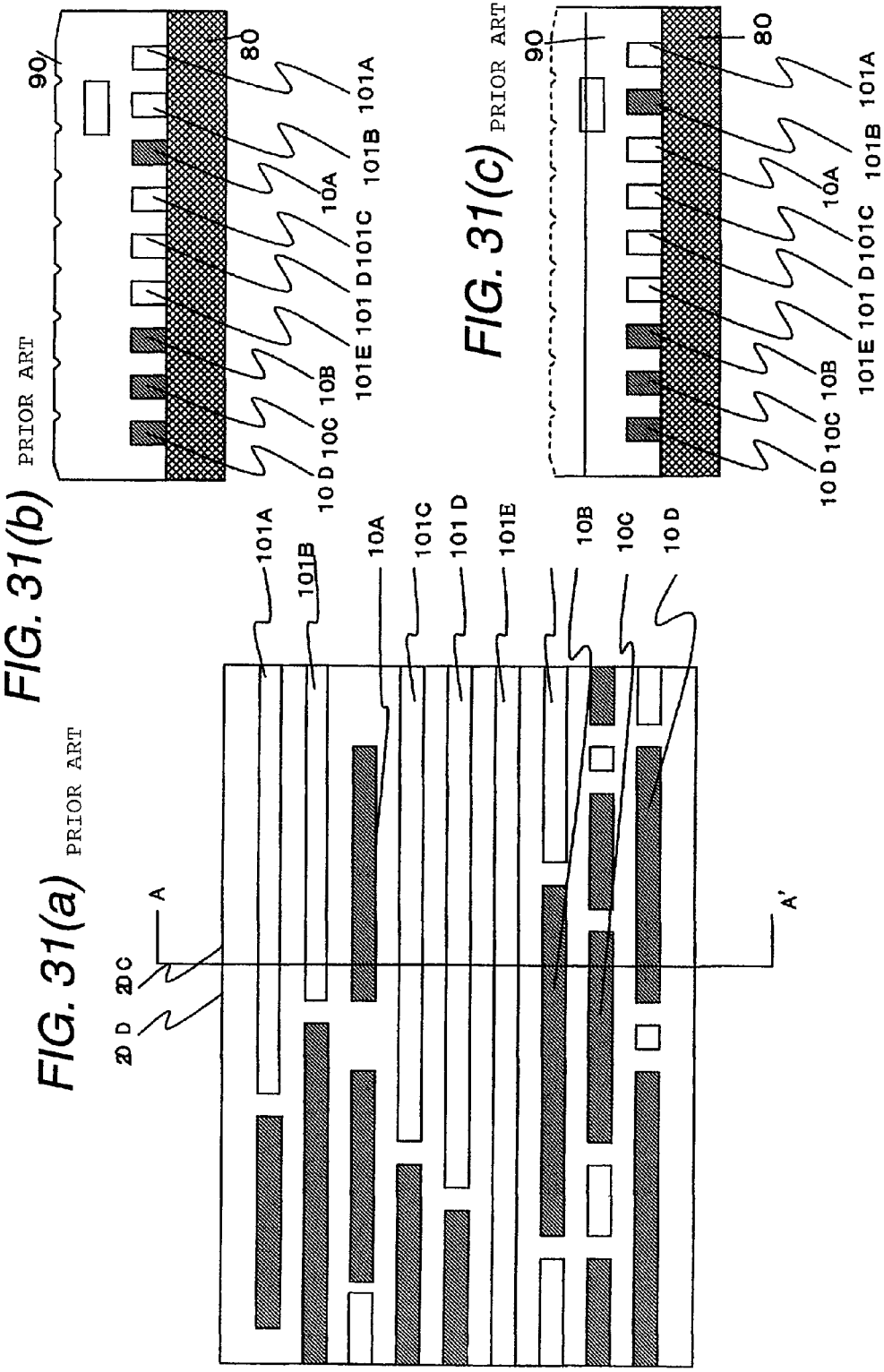

SEMICONDUCTOR INTEGRATED CIRCUIT APPARATUS WITH LOW WIRING RESISTANCE

BACKGROUND OF THE INVENTION

1. Field of the Invention

The present invention relates to a semiconductor integrated circuit and a method and apparatus for designing a wiring pattern of the semiconductor integrated circuit, and more particularly to a semiconductor integrated circuit apparatus which is effective for designing a semiconductor integrated circuit using a multilayer wiring layer, a wiring pattern designing method and a wiring pattern designing apparatus.

2. Description of the Related Art

In a semiconductor integrated circuit apparatus, conventionally, a multilayer wiring technique has been used to enhance a degree of integration.

If a wiring layer has the variation of wiring pattern density, there are the following two drawbacks.

As a first drawback, finishing precision in a wiring is deteriorated by a loading effect. The loading effect implies a phenomenon in which a finishing dimension of the pattern fluctuates depending on the density of the pattern. The loading effect is caused by an optical proximity effect in a photolithographic step and the excessive or insufficient amount of an etching gas in an etching step.

A second drawback relates to a controllability of an interlayer insulating film on a wiring layer.

FIG. 30 is a view showing a sectional structure of a wiring. As shown in FIG. 30, an interlayer insulating film 90 is flat in a region A in which first layer wiring patterns 10A, 10B and 10C are arranged regularly at an interval which is equal to or smaller than a predetermined interval, and a dent region is formed on the interlayer insulating film 90 so that a concavo-convex portion is generated in a region B in which the interval has a predetermined value or more as in the first layer wiring patterns 10C and 10D. A second layer wiring is formed on the concavo-convex portion. For this reason, there is a problem in that a thickness of a film is reduced in a step portion or precision in the pattern is deteriorated to cause a disconnection, and a manufacturing defective rate is increased.

Moreover, a chemical mechanical polishing method (CMP) has widely been used as a technique for flattening an interlayer insulating film. In the case in which a wiring pattern has a variation of density, however, it is hard to completely carry out the flattening. A wiring in a microfabricating process has a problem to be considered in addition to the above drawbacks.

As a third drawback, a capacitance of the wiring is changed depending on the presence of an adjacent wiring.

A wiring spacing is extremely reduced due to an increase in integration, and a parasitic capacitance between adjacent or intersecting wirings is greater than a parasitic capacitance between a signal wiring and a silicon substrate. As a result, the cross talk which causes noise and signal delay by coupling signal lines.

As a fourth drawback, a wiring resistance is increased. A thickness of a wiring is increasingly reduced due to a decrease in a wiring dimension with a process scaling and a length of the wiring is increased more and more due to a high degree of integration, and the wiring resistance is increased. For this reason, an RC delay of the wiring (a delay generated by a resistance component and a capacity component of the wiring) is greater than a transistor delay.

As the conventional art for the first and second drawbacks caused by a nonuniformity of the wiring, there has been invented an automatic wiring method for generating a flattened pattern (a wiring dummy pattern) in an empty region. For example, Patent Document 1 has disclosed an automatic wiring method for a semiconductor apparatus which serves to search for an empty region in which a wiring path is not present and to generate a redundant wiring which does not come in contact with an element and a wiring in the empty region (claim 1) in order to form a flat wiring layer without a variation in the wiring (the abstract and object of the Patent Document 1).

The automatic wiring method is executed in the following manner in accordance with a flowchart showing a flow of steps in FIG. 23.

First of all, at S100, data representing a wiring path in each layer are held in a wiring path storing apparatus.

At S200, next, an empty region in which a wiring path is not present is searched. At subsequent S300, a redundant wiring which does not come in contact with an element and a wiring is generated in the empty region.

This method will be specifically described with reference to FIG. 24. FIG. 24 shows a wiring pattern. In a semiconductor integrated circuit apparatus 700, first layer wiring patterns 10A and 10B which are vertically adjacent to each other and second layer wiring patterns 20A and 20B are shown. Moreover, description will be given on the assumption that a horizontal direction is preferentially used in the first layer wiring pattern 10 and a perpendicular direction is preferentially used in the second layer wiring pattern 20.

The first layer wiring 10 is provided on a first layer wiring grid line 11 and the second layer wiring 20 is provided on a second layer wiring grid line 21. The first layer wirings 10A and 10B and the second layer wirings 20A and 20B are connected to each other through vias 30A and 30B, 50A and 50B denote a net to be wired at an equal electric potential. FIG. 24 shows two nets 50A and 50B.

At the S100, data indicative of a wiring path in each layer based on the wiring pattern in FIG. 24 are held in a wiring path storing apparatus.

In FIG. 25, a portion related to the first layer wiring is extracted from the wiring pattern in FIG. 24. At the step S200 in which the empty region is searched, a region which is not occupied by the first layer wiring patterns 10A and 10B in the first layer wiring grid line 11 in FIG. 25 is searched as a first layer empty region 12.

At the subsequent S300, as shown in FIG. 26, redundant flattened patterns 101A, 101B and 101C which do not come in contact with the first layer wirings 10A and 10B are generated in the first layer empty region 12. In FIG. 27, the via 30 and the second layer wiring pattern 20 are added to FIG. 26.

For a conventional flattened pattern generating method, a method using a wiring pattern area ratio (a rate of an area occupied by a wiring with respect to a whole area in each wiring layer) as an index of a uniformity of the wiring has often been utilized. For example, as shown in Patent Document 2, there has been disclosed "a pattern generating method wherein a flattened pattern capable of achieving a target value of a pattern area ratio is actually disposed in an empty region of a semiconductor integrated circuit apparatus based on a result of an area ratio verifying method". In the case in which the pattern area ratio is used, it is sufficient that the area ratio in a region to be aimed is satisfied. Therefore, a wiring may have a density locally.

In addition to the first and second drawbacks, for the drawback that the capacitance value of the wiring is changed depending on the presence of the third adjacent wiring, Patent Document 3 has disclosed a technique for disposing either an actual wiring or a dummy wiring on all grids of a semiconductor integrated circuit in order to cause a wiring capacity to be uniform, and furthermore, fixing the dummy wiring to a certain electric potential, thereby eliminating a density of the wiring and causing a capacity between the wirings to be uniform (Paragraph [0009] in the Patent Document 3).

For a fourth drawback that a wiring resistance is increased, Patent Document 4 has disclosed a semiconductor integrated circuit optimizing method for increasing a wiring width after the wiring.

FIG. 28 is a flowchart showing the conventional technique described in the Patent Document 4. An element is disposed at S50, a wiring is carded out at S60, a wiring causing a violation of a design restriction such as a delay or a cross talk is extracted at S70, a width of only a horizontal segment which is parallel with a cell row of the extracted wiring is increased at S80, and a horizontal interval is increased when a perpendicular interval between the horizontal segment and a circuit component which is close to the horizontal segment is smaller than a predetermined threshold at S90.

The method will be specifically described with reference to the drawings. It is assumed that a result of the wiring in the S60 is set into a state shown in FIG. 20. In FIG. 24, the cell row is not shown for simplicity. FIG. 24 is the same as the drawings used for the explanation of the Patent Document 1 and the reference numerals have been described above. It is assumed that the net 50B is extracted as the wiring causing the violation of the design restriction in the S70. At the subsequent 580, as shown in FIG. 29, a width of the horizontal segment 50B is increased. At the S90, if a wiring spacing 42 between the first wiring layers does not satisfy a minimum interval rule specified by a design rule due to an increase in the wiring width at the S80, the wiring spacing 42 between the first layer wirings is increased so as to satisfy the design rule by a compaction in a perpendicular direction.

Patent Document 1: JP-A-5-63085 Publication
Patent Document 2: JP-A-2005-222214 Publication
Patent Document 3: Japanese Patent No. 3137072 Publication
Patent Document 4: JP-A-2001-34646 Publication The methods (the Patent Documents 1 to 3) of generating a flattened pattern (or a flattened dummy) according to the prior art in the Patent Documents 1 to 3 do not take the wiring resistance to be the fourth drawback into consideration. Moreover, all of the flattened pattern generating methods according to the prior art serve to generate a redundant wiring which does not come in contact with a wiring in an empty region and only use the empty region for mainly generating a flattened pattern, and do not consider that a wiring resistance is reduced by using the empty region and there is a problem in that the wiring resistance is increased.

As in the semiconductor integrated circuit optimizing method described in the Patent Document 4, moreover, when the wiring width is simply increased after the wiring, a wiring spacing rule 42 depending on the wiring width (a design rule in which a wiring spacing is to be increased with an increase in a wiring width) is applied to a deep sub-micron process. For this reason, a design becomes complicated.

In a designing method based on a minimum wiring width and wiring spacing as in a wiring grid used in an automatic place and route tool in an ASIC designing technique, particularly, there is a problem in that a design is complicated if a wide wiring is partially handled.

SUMMARY OF THE INVENTION

In consideration of the actual circumstances, it is an object of the invention to provide a semiconductor integrated circuit which can easily be designed and has a low wiring resistance, and a method and apparatus for designing the semiconductor integrated circuit.

In order to achieve the object, the invention provides a semiconductor integrated circuit apparatus wherein a first wiring layer is provided with a plurality of signal wirings having an equal width which is disposed in parallel with each other at a regular interval, and at least two of the signal wirings which are adjacent to each other are electrically connected to each other.

According to the structure, also in the case in which it is decided that a region is to be corrected, at least two adjacent signal wirings are electrically connected to each other over the same wiring layer. Therefore, it is possible to reduce a wiring resistance without changing others, and furthermore, to obtain a degree of freedom in a layout design.

In the invention, in the semiconductor integrated circuit apparatus, the at least two adjacent signal wirings are electrically connected to each other in a plurality of portions.

In the invention, in the semiconductor integrated circuit apparatus, the at least two adjacent signal wirings are electrically connected to each other at both ends of a section in which the adjacent signal wirings are provided in parallel with each other.

In the invention, in the semiconductor integrated circuit apparatus, the at least two adjacent signal wirings are electrically connected to each other over the same wiring layer.

According to the structure,

In the invention, in the semiconductor integrated circuit apparatus, all of the at least two adjacent signal wirings and wirings for electrically connecting the adjacent signal wirings have an equal width.

Moreover, the invention provides a semiconductor integrated circuit apparatus wherein a first wiring layer is provided with signal wirings and dummy patterns which have equal widths and are disposed in parallel with each other at regular intervals, and at least two of the signal wirings which are adjacent to each other are electrically connected to each other.

In the invention, in the semiconductor integrated circuit apparatus, the at least two adjacent signal wirings are electrically connected to each other in a plurality of portions.

In the invention, in the semiconductor integrated circuit apparatus, the at least two adjacent signal wirings are electrically connected to each other at both ends of a section in which the adjacent signal wirings are provided in parallel with each other.

In the invention, in the semiconductor integrated circuit apparatus, the at least two adjacent signal wirings are electrically connected to each other over the same wiring layer.

In the invention, in the semiconductor integrated circuit apparatus, all of the at least two adjacent signal wirings and wirings for electrically connecting the adjacent signal wirings have an equal width.

Furthermore, the invention provides a semiconductor integrated circuit apparatus comprising a first wiring group in which a first wiring layer is provided with a plurality of signal wirings having an equal width which is disposed in parallel with each other at a regular interval, and at least two of the signal wirings which are adjacent to each other are electrically connected to each other, and a second wiring group in which a second wiring layer is provided with a plurality of signal wirings having an equal width which is disposed in parallel with each other at a regular interval, and at least two of the signal wirings which are adjacent to each other are electrically connected to each other, wherein the first wiring group and the second wiring group are electrically connected to each other through a via.

In the invention, in the semiconductor integrated circuit apparatus, the at least two adjacent signal wirings are electrically connected to each other in a plurality of portions.

In the invention, in the semiconductor integrated circuit apparatus, the at least two adjacent signal wirings are electrically connected to each, other at both ends of a section in which the adjacent signal wirings are provided in parallel with each other.

In the invention, in the semiconductor integrated circuit apparatus, the at least two adjacent signal wirings are electrically connected to each other in the same wiring layer.

In the invention, in the semiconductor integrated circuit apparatus, all of the at least two adjacent signal wirings and wirings for electrically connecting the adjacent signal wirings have an equal width.

Moreover, the invention provides a method comprising an inputting step of inputting a design rule and a wiring pattern of each layer, an empty region extracting step of extracting an empty region in which the wiring pattern is not present, a reinforcing target wiring pattern extracting step of extracting any of the wiring patterns having the empty region provided therearound which is to be reinforced by using the wiring pattern and information about the empty region, and a wiring reinforced pattern generating step of generating a wiring reinforced pattern to cause the wiring pattern to be uniform based on an arrangement of the design rule and the wiring pattern which are input at the inputting step in the empty region provided around the reinforcing target wiring pattern and electrically connecting the wiring reinforced pattern to the reinforcing target wiring pattern.

According to the structure, a wide wiring is not used but the wiring reinforced pattern is formed in the empty region to electrically connect the wiring reinforced patterns, and the empty region of the wiring is used for generating a flattened pattern as in the conventional art, and furthermore, is used for a wiring reinforcement. Therefore, the empty region can be utilized effectively. In addition, the design rule with an existent surrounding wiring pattern is considered in order to carry out a layout design independently of the wiring pattern in the wiring reinforcement. Therefore, the existent surrounding wiring pattern is not influenced. By generating a reinforced wiring pattern considering a uniformity of the wiring pattern, moreover, it is possible to reduce a wiring resistance and to improve a yield simultaneously with the flattening. In other words, a pattern arrangement is made uniform by the wiring pattern and the reinforced wiring pattern.

In the invention, the method of designing a semiconductor integrated circuit comprises an inputting step of inputting a preset design rule and a wiring pattern of each layer, an empty region extracting step of extracting an empty region in which the wiring pattern is not present, a reinforcing target wiring pattern extracting step of extracting any of the wiring patterns having an empty region provided therearound which is to be reinforced by using the wiring pattern and information about the empty region, a wiring reinforced pattern generating step of generating, in the empty region provided around the reinforcing target wiring pattern, a wiring reinforced pattern to be electrically connected to the reinforcing target wiring pattern in such a manner that the wiring pattern is uniform based on an arrangement of the design rule and the wiring pattern, and a dummy pattern step of generating, in the empty region, a dummy pattern which is not electrically connected to the wiring pattern in accordance with the design rule.

According to the structure, a wide wiring is not used but two types of patterns, that is, a wiring reinforced pattern to be electrically connected to the wiring pattern and a so-called dummy pattern for flattening which is not connected electrically are disposed in the empty region. Although the dummy pattern which is not electrically connected to the wiring pattern indicates a floating pattern, it can be electrically connected to the other wiring layers and can also function as a functional pattern. In particular, there is added the step of generating a dummy pattern in addition to the structure. By the structure, it is possible to carry out further flattening.

In the invention, in the method of designing a semiconductor integrated circuit, the wiring reinforced pattern generating step includes a step of generating a wiring reinforced pattern to be electrically connected to the reinforcing target wiring pattern in a shape of a donut or a mesh in such a manner that the wiring pattern is uniform based on the arrangement of the design rule and the wiring pattern in the empty region provided around the reinforcing target wiring pattern.

According to the structure, by causing the reinforced wiring pattern to take a shape of a doughnut or a mesh, a wide wiring spacing rule is not applied to the wide wiring so that a design can be prevented from being complicated.

In the invention, in the method of designing a semiconductor integrated circuit, the reinforcing target wiring pattern extracting step includes a reinforcing target wiring pattern extracting step of extracting, as a wiring pattern to be reinforced, the wiring pattern having an empty region in at least an upper layer or a lower layer of the wiring pattern by using the wiring pattern and the information about the empty region, and the wiring reinforced pattern generating step includes a step of generating a reinforced pattern of a wiring which is to be electrically connected to the reinforcing target wiring pattern through a via in such a manner that the wiring pattern is uniform based on the arrangement of the design rule and the wiring pattern in the upper and lower empty regions of the reinforcing target wiring pattern.

By the structure, the reinforced pattern of the wiring is generated. Consequently, it is possible to reduce a wiring resistance by effectively utilizing an empty region of a different layer in addition to the same layer.

In the invention, in the method of designing a semiconductor integrated circuit, the reinforcing target wiring pattern extracting step includes a step of extracting, as a wiring pattern to be preferentially reinforced, any of the wiring patterns which has a smaller width than a predetermined wiring width and a greater length than a predetermined wiring length.

By the structure, it is possible to preferentially reinforce a wiring pattern having a small wiring width and a great wiring length which easily causes an open error in a manufacture. Therefore, it is possible to prevent a yield from being reduced by the open error.

In the invention, moreover, the method of designing a semiconductor integrated circuit comprises a step of disposing wiring patterns in the respective layers on a grid line in parallel with each other at a regular interval, and disposing wiring reinforced patterns in the respective layers on the grid line.

By the structure, in addition to the advantage, the wiring pattern and the wiring reinforced pattern are assigned on the same grid line. Therefore, the shape of the wiring is manufactured uniformly.

In the invention, furthermore, the method of designing a semiconductor integrated circuit comprises a step of disposing wiring patterns in the respective layers on a grid line in parallel with each other at a regular interval, and disposing wiring reinforced patterns in the respective layers on the grid line.

By the structure, all of the wiring pattern, the wiring reinforced pattern and the dummy pattern are disposed on the same grid line. Therefore, it is possible to cause the density of the wiring to be locally or broadly uniform. Moreover, the structure can correspond to all of the first to fourth drawbacks in the multilayer wiring technique which has been described in the "Background Art", and the shape of the wiring is manufactured uniformly. In addition, it is also possible to cause a capacity between the wirings to be uniform, and furthermore, to reduce a wiring resistance by effectively utilizing the empty region.

In the invention, the method of designing a semiconductor integrated circuit comprises an inputting step of inputting a design rule, a wiring pattern area ratio of each layer and a wiring pattern of each layer, an empty region extracting step of extracting an empty region in which the wiring pattern is not present, a dummy pattern generating step of generating, in the empty region, a dummy pattern which is not electrically connected to the wiring pattern in accordance with the design rule, a wiring pattern area ratio error region extracting step of calculating a wiring pattern area ratio in each layer and extracting a wiring region which does not satisfy the wiring pattern area ratio of the layer which is set, a correcting target wiring pattern extracting step of extracting the wiring pattern in the wiring pattern area ratio error region which satisfies a condition that an interval between the wiring patterns is greater than a minimum value of the design rule and is too small to generate the dummy pattern therebetween, and a wiring pattern correcting step of enlarging the correcting target wiring pattern in accordance with the design rule in order to satisfy the wiring pattern area ratio.

By the structure, there is provided the step of correcting a wiring pattern in an area ratio error region. It is possible to enlarge the wiring pattern itself in order to improve an area ratio in a portion having no room for generating the dummy pattern in the area ratio error region. Also in the case in which only the generation of the dummy pattern cannot satisfy the area ratio, accordingly, the area ratio can be improved.

In the invention, moreover, the method of designing a semiconductor integrated circuit comprises an inputting step of inputting a design rule, a wiring pattern area ratio of each layer and a wiring pattern of each layer, a wiring pattern area ratio error region extracting step of calculating a wiring pattern area ratio in each layer and extracting a wiring region which does not satisfy the wiring pattern area ratio of the layer which is set, a correcting target wiring pattern extracting step of extracting the wiring pattern in the wiring pattern area ratio error region which satisfies a condition that an interval between the wiring patterns is greater than a minimum value of the design rule and is too small to generate the dummy pattern therebetween, a wiring pattern correcting step of enlarging the correcting target wiring pattern in accordance with the design rule in order to satisfy the wiring pattern area ratio, an empty region extracting step of extracting an empty region in which the wiring pattern is not present, and a dummy pattern generating step of generating, in the empty region, a dummy pattern which is not electrically connected to the wiring pattern in accordance with the design rule.

In addition, the invention provides an apparatus for designing a semiconductor integrated circuit comprising an inputting portion for inputting a design rule and a wiring pattern of each layer, an empty region extracting portion for extracting an empty region in which the wiring pattern is not present, a reinforcing target wiring pattern extracting portion for extracting any of the wiring patterns having an empty region provided around the wiring pattern which is to be reinforced by using the wiring pattern and information about the empty region, and a wiring reinforced pattern generating portion for generating, in the empty region provided around the reinforcing target wiring pattern, a wiring reinforced pattern to be electrically connected to the reinforcing target wiring pattern in such a manner that the wiring pattern is uniform based on the design rule and the wiring pattern.

Moreover, the invention provides an apparatus for designing a semiconductor integrated circuit comprises an inputting portion for inputting a design rule, a wiring pattern area ratio of each layer and a wiring pattern of each layer, an empty region extracting portion for extracting an empty region in which the wiring pattern is not present, a dummy pattern generating portion for generating, in the empty region, a dummy pattern which is not electrically connected to the wiring pattern in accordance with the design rule, a wiring pattern area ratio error region extracting portion for calculating a wiring pattern area ratio in each layer and extracting a wiring region which does not satisfy the wiring pattern area ratio of the layer which is set, a correcting target wiring pattern extracting portion for extracting the wiring pattern in the wiring pattern area ratio error region which satisfies a condition that an interval between the wiring patterns is greater than a minimum value of the design rule and is too small to generate the dummy pattern therebetween, and a wiring pattern correcting portion for enlarging the correcting target wiring pattern in accordance with the design rule in order to satisfy the wiring pattern area ratio.

According to the structure, the empty region of the wiring is used for generating the dummy pattern as in the conventional art, and furthermore, is used for the wiring reinforcement. Therefore, the empty region can be effectively utilized. In addition, the design rule with the existent surrounding wiring pattern is taken into consideration in the wiring reinforcement. Therefore, the existent surrounding wiring pattern is not influenced.

By generating the reinforced wiring pattern taking the uniformity of the wiring pattern into consideration, moreover, it is possible to reduce a wiring resistance and to improve a yield simultaneously with flattening.

BRIEF DESCRIPTION OF THE DRAWINGS

FIG. 20 is a view showing a planar structure and a sectional structure in a semiconductor integrated circuit apparatus according to a sixth embodiment of the invention, FIG. 22 is a view showing the planar structure and the sectional structure in the semiconductor integrated circuit apparatus according to the sixth embodiment of the invention, FIG. 31 is a view for explaining a method of manufacturing a semiconductor integrated circuit apparatus according to the conventional art.

DESCRIPTION OF THE PREFERRED EMBODIMENTS

First Embodiment

A first embodiment according to the invention will be described below in detail with reference to the drawings.

Figure 1:
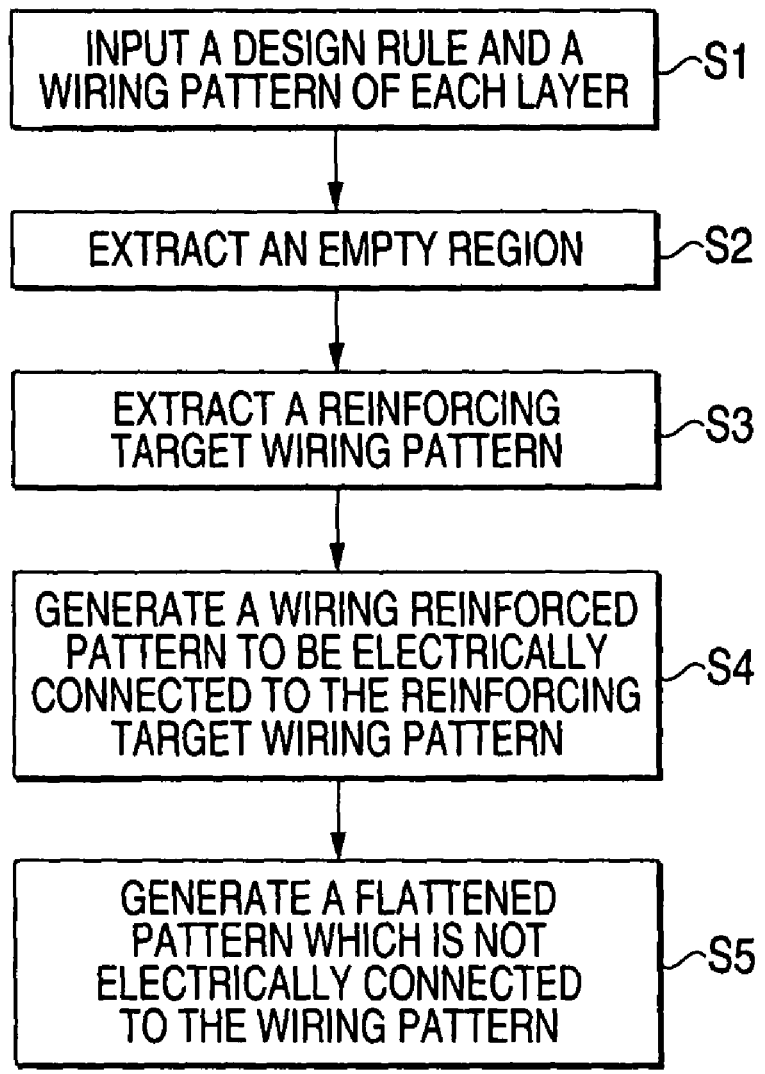
FIG. 1 is a flowchart showing a processing procedure for a wiring pattern designing method according to a first embodiment of the invention.

In the first embodiment, as shown in a flowchart of FIG. 1, an empty region having no wiring pattern is extracted (an empty region extracting step: S2) after an inputting step of inputting a design rule and a wiring pattern of each layer (S1), a reinforcing target wiring pattern for extracting a wiring pattern to be reinforced is extracted from the wiring pattern having an empty region provided around the wiring pattern by using the wiring pattern and information about the empty region (a reinforcing target wiring pattern extracting step: S3), a wiring reinforced pattern is generated and is electrically connected to the reinforcing target wiring pattern to obtain a uniform wiring pattern based on the design rule and an arrangement of the wiring pattern in the empty region provided around the reinforcing target wiring pattern (a wiring reinforced pattern generating step: S4), and furthermore, a dummy pattern which is not electrically connected to the wiring pattern is generated in accordance with the design rule in the empty region (a dummy pattern generating step: S5).

Figure 16:
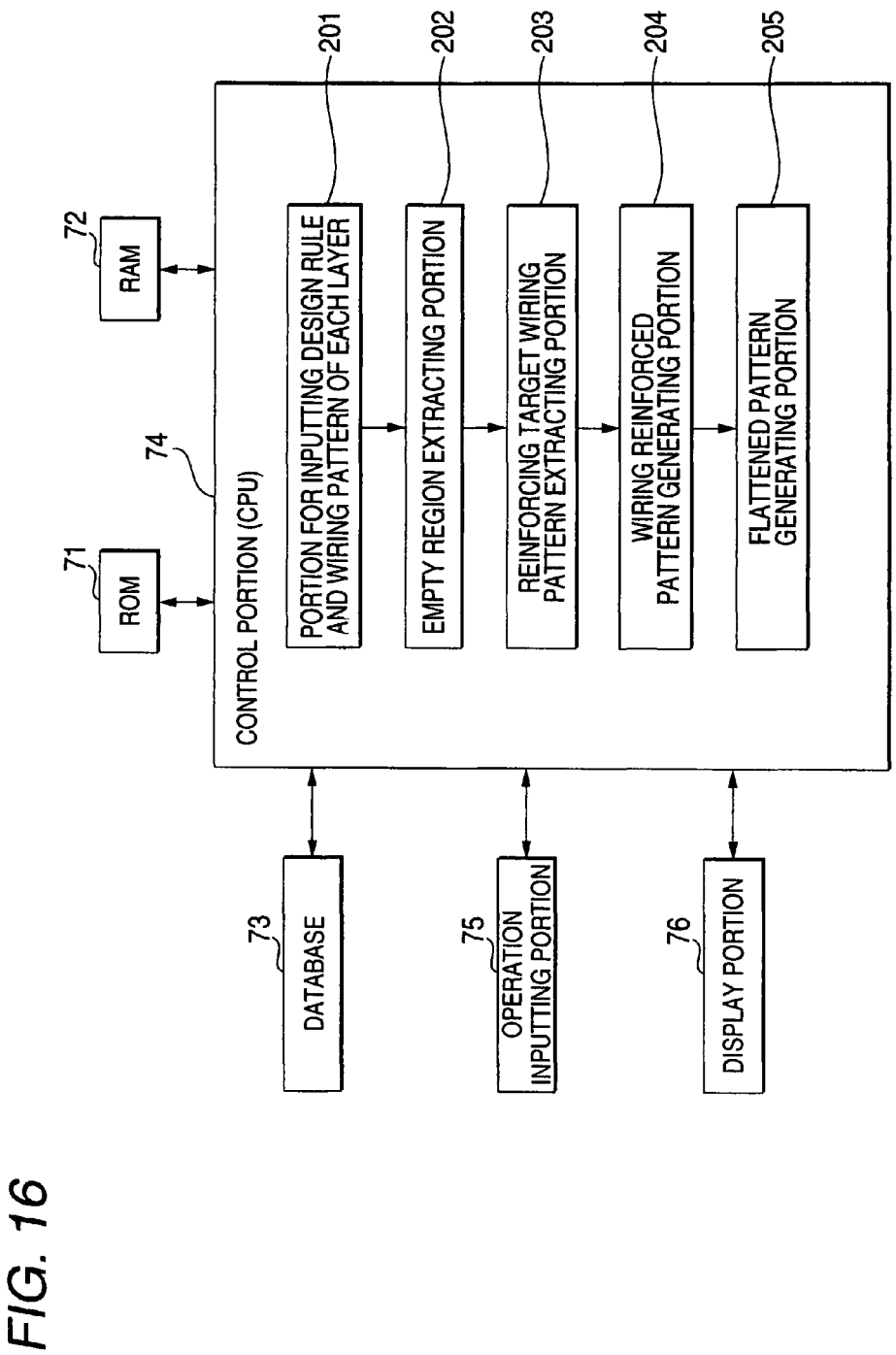
FIG. 16 is a block diagram showing a structure of a wiring pattern designing apparatus according to the first embodiment of the invention.

The process is implemented by an apparatus for designing a wiring pattern of a semiconductor integrated circuit as shown in a block diagram illustrating an example of a structure of a main part in FIG. 16. In FIG. 16, a wiring pattern designing apparatus 70 comprises an ROM 71 to be a first storing portion (a readable recording medium) in which a control program and data for a wiring pattern design are stored, an RAM 72 to be a second storing portion which functions as a work memory, a database 73 in which various data for the wiring pattern design are recorded, an operation inputting portion 75 capable of causing a user to input various operation commands (including a starting or end command for the wiring pattern design), a display portion 76 capable of displaying various screen information such as an initial screen for the wiring pattern design, and a control portion 74 for controlling each portion based on the control program and the data, and supports the wiring pattern design of the semiconductor integrated circuit.

The control portion 74 is constituted by a CPU (central processing unit). Layout data and a design rule are fetched from the database 73 by the control portion 74 and a processing is successively executed in accordance with the control program read from the ROM 71. The layout data include various data related to a layout, for example, shapes and arrangement of devices in addition to the wiring pattern.

More specifically, in the apparatus, the control portion 74 includes an inputting portion 201 for fetching layout data and a design rule from the database 73 and using the control program read from the ROM 71, the operation inputting portion 75 and the display portion 76 to input the design rule and a wiring pattern of each layer, an empty region extracting portion 202 for extracting an empty region in which the wiring pattern is not present, a reinforcing target wiring pattern extracting portion 203 for extracting a wiring pattern to be reinforced from the wiring pattern having the empty region provided around the wiring pattern by using the wiring pattern and information about the empty region, a wiring reinforced pattern generating portion 204 for generating a wiring reinforced pattern to be electrically connected to the reinforcing target wiring pattern in order to obtain a uniform wiring pattern based on the design rule and an arrangement of the wiring pattern in the empty region provided around the reinforcing target wiring pattern, and a dummy pattern generating portion 205.

Description will be given to an operation for carrying out a design using the wiring pattern designing apparatus.

Figure 24:
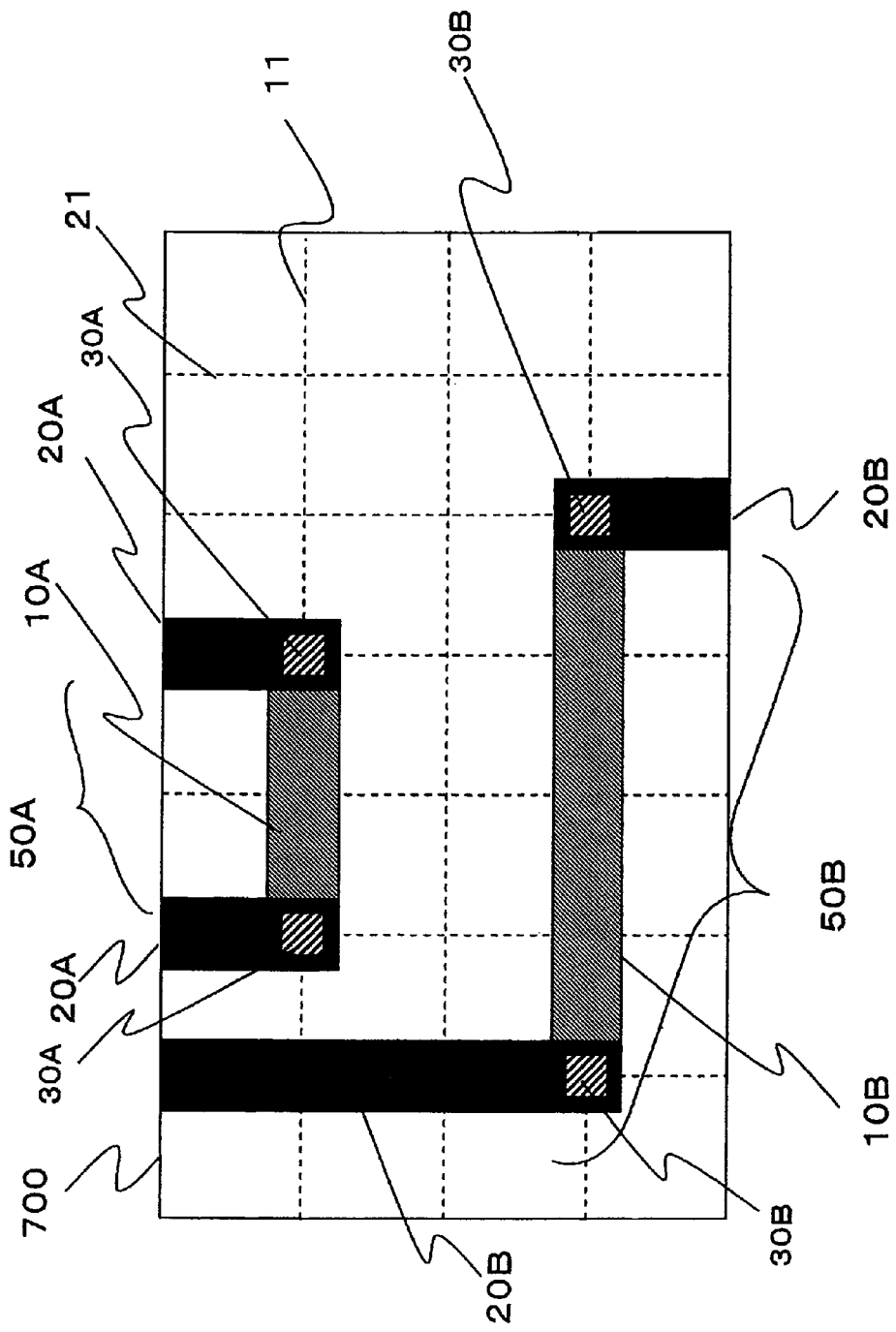
FIG. 24 is a view showing a wiring pattern to be input according to the conventional art and the first to third embodiments of the invention.

FIG. 1 is the flowchart showing a processing procedure for a method of designing a wiring pattern of a semiconductor integrated circuit according to the first embodiment of the invention. In FIG. 1, the inputting step S1 serves to input a preset design rule and a wiring pattern of each layer from the database 73. FIG. 24 shows a wiring pattern of each layer to be input. FIG. 24 is the same as that described in the Background Art.

Figure 25:
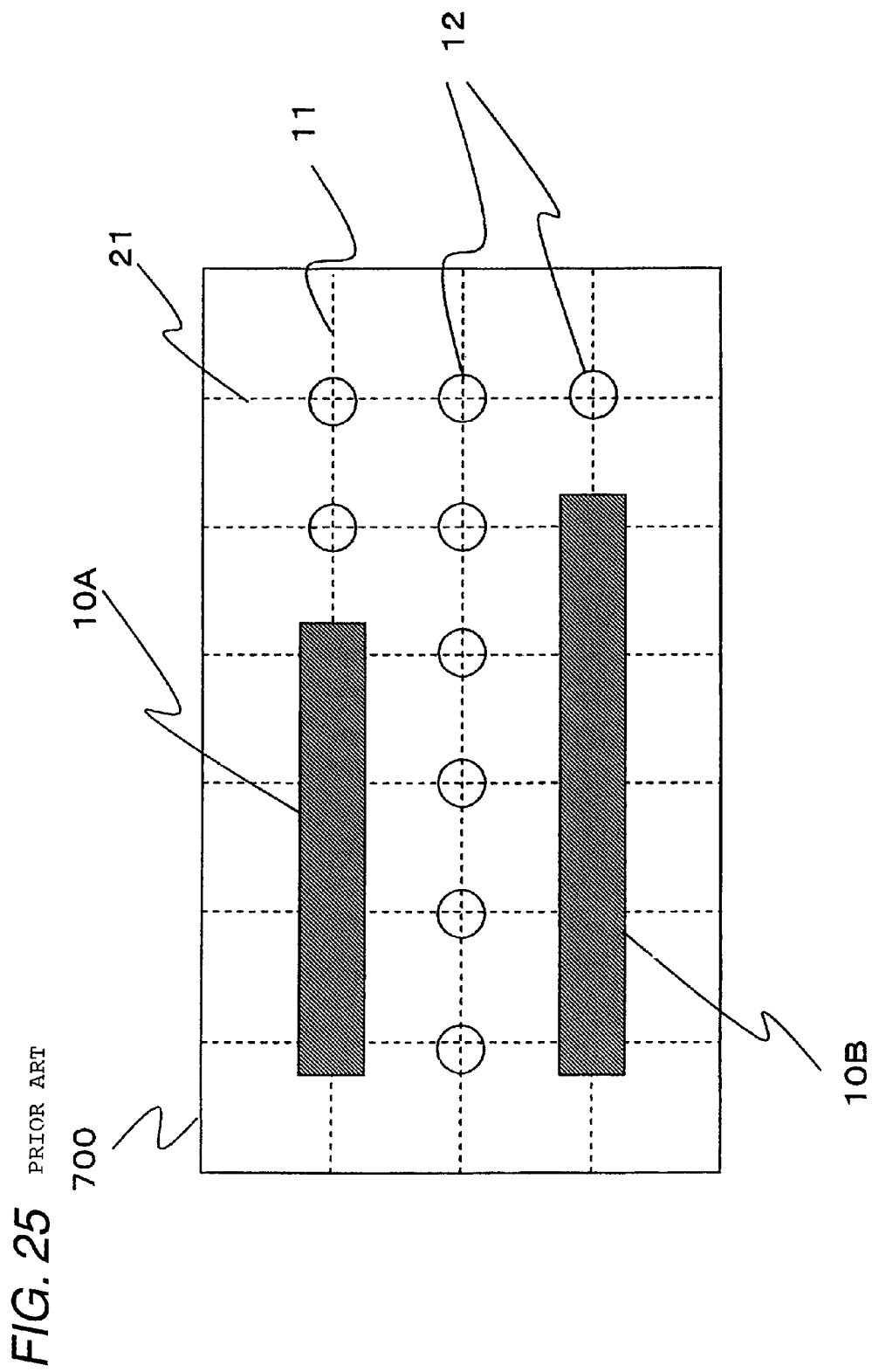
FIG. 25 is a view for explaining an empty region extracting step according to the conventional art and the first to third embodiments of the invention.
Figure 26:
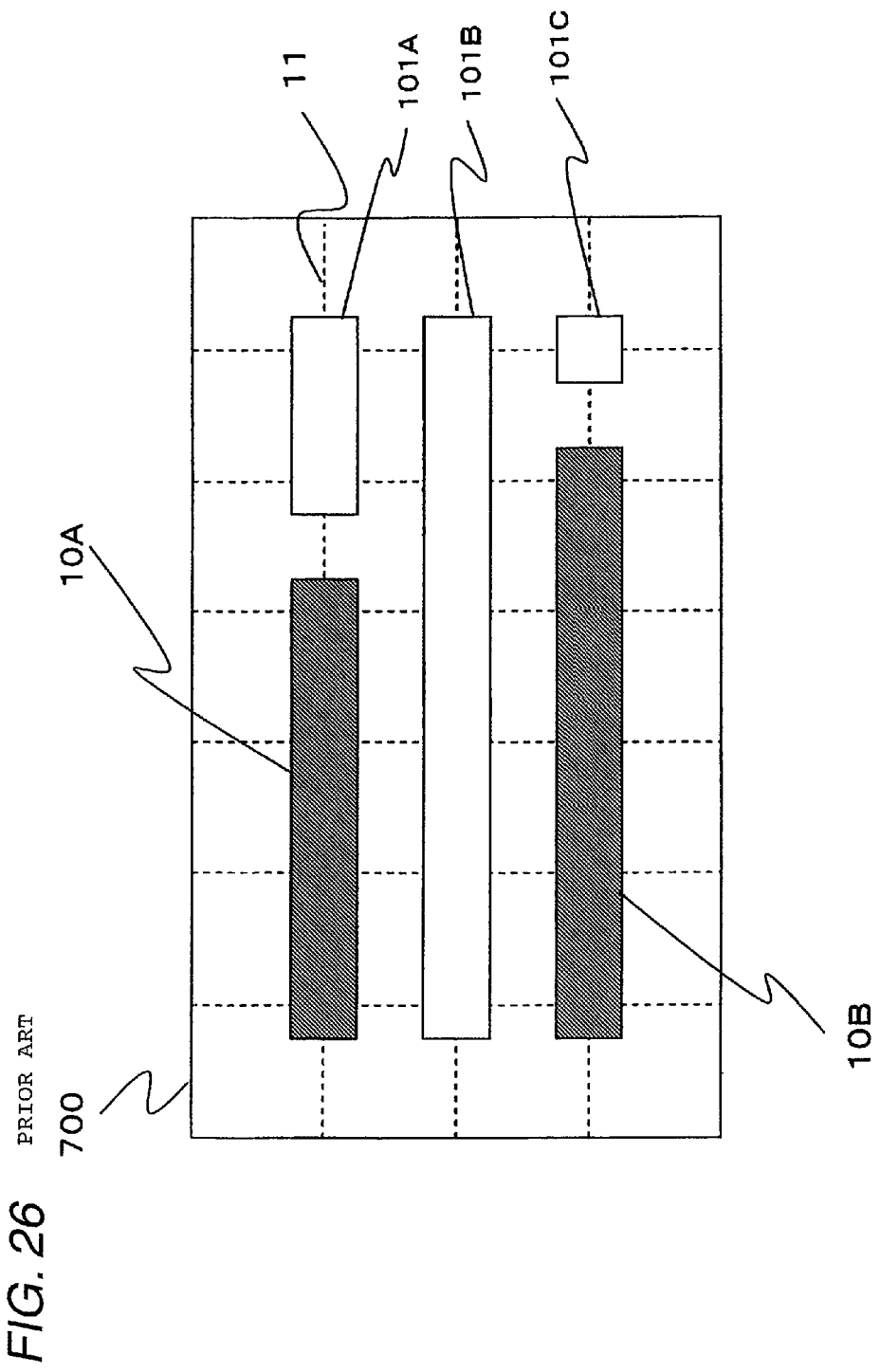
FIG. 26 is a view showing a dummy pattern generating result of a first layer according to the conventional art.
Figure 27:
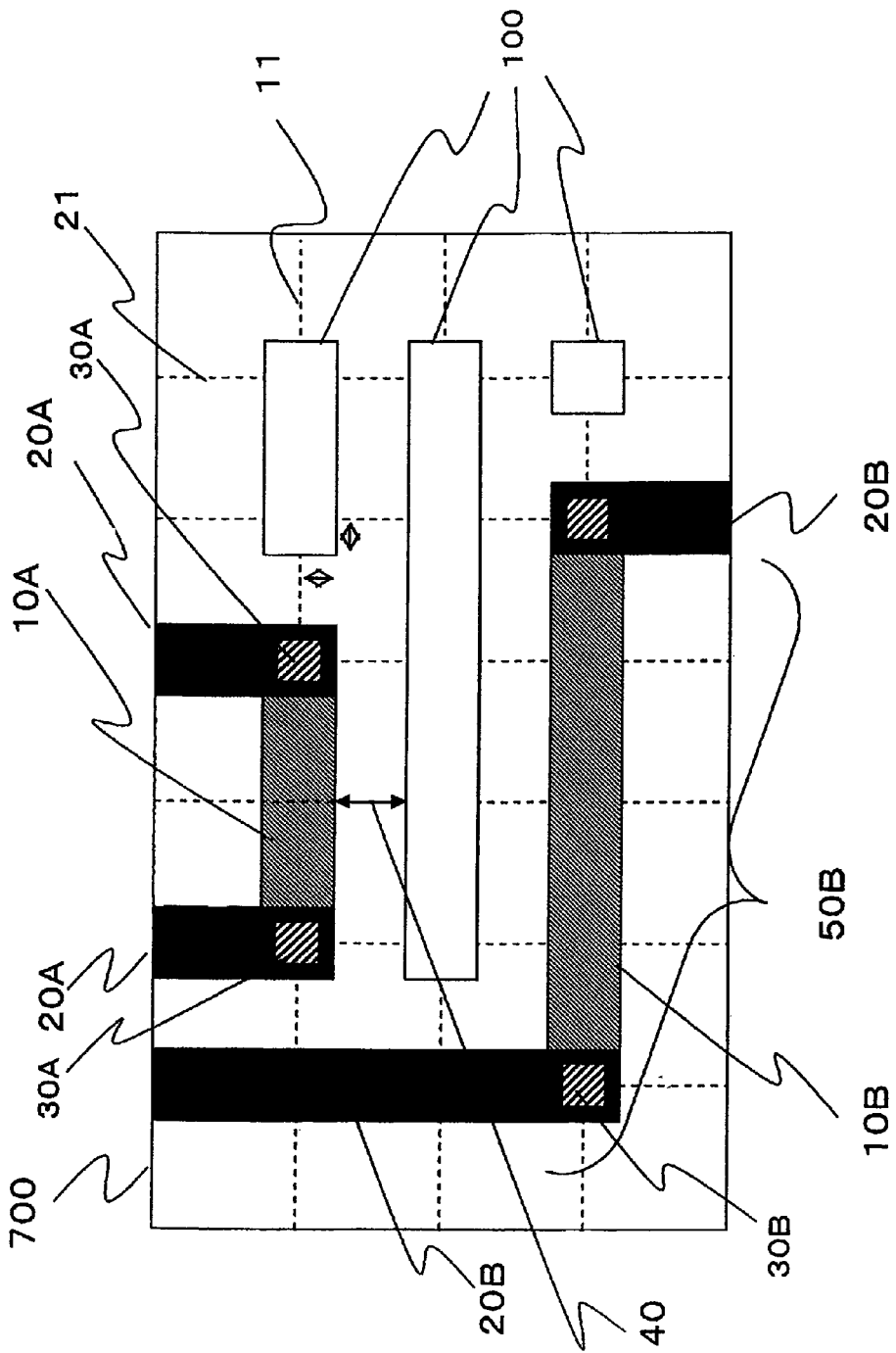
FIG. 27 is a view showing a layout obtained after a dummy pattern is generated according to the conventional art.
Figure 28:
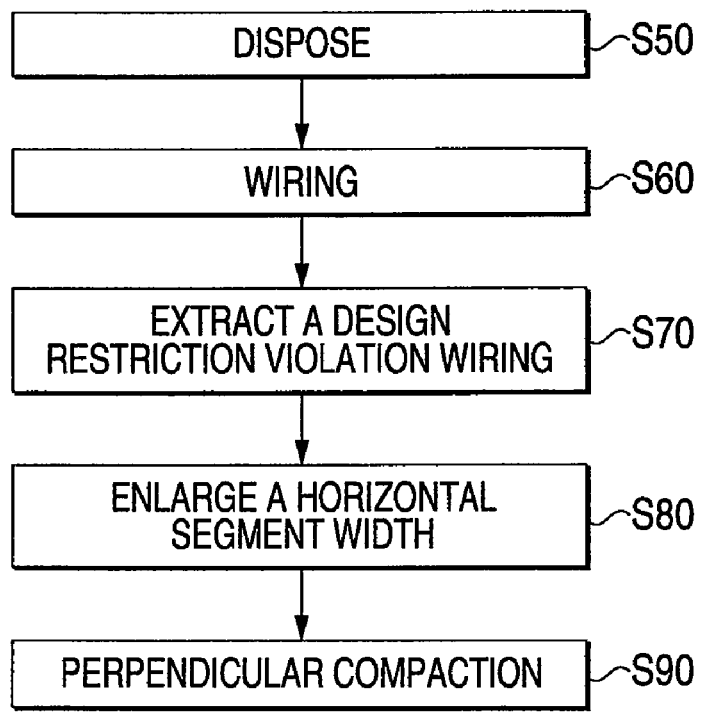
FIG. 28 is a flowchart showing a flow of the steps of a semiconductor integrated circuit optimizing method according to the prior art (Patent Document 4)
Figure 29:
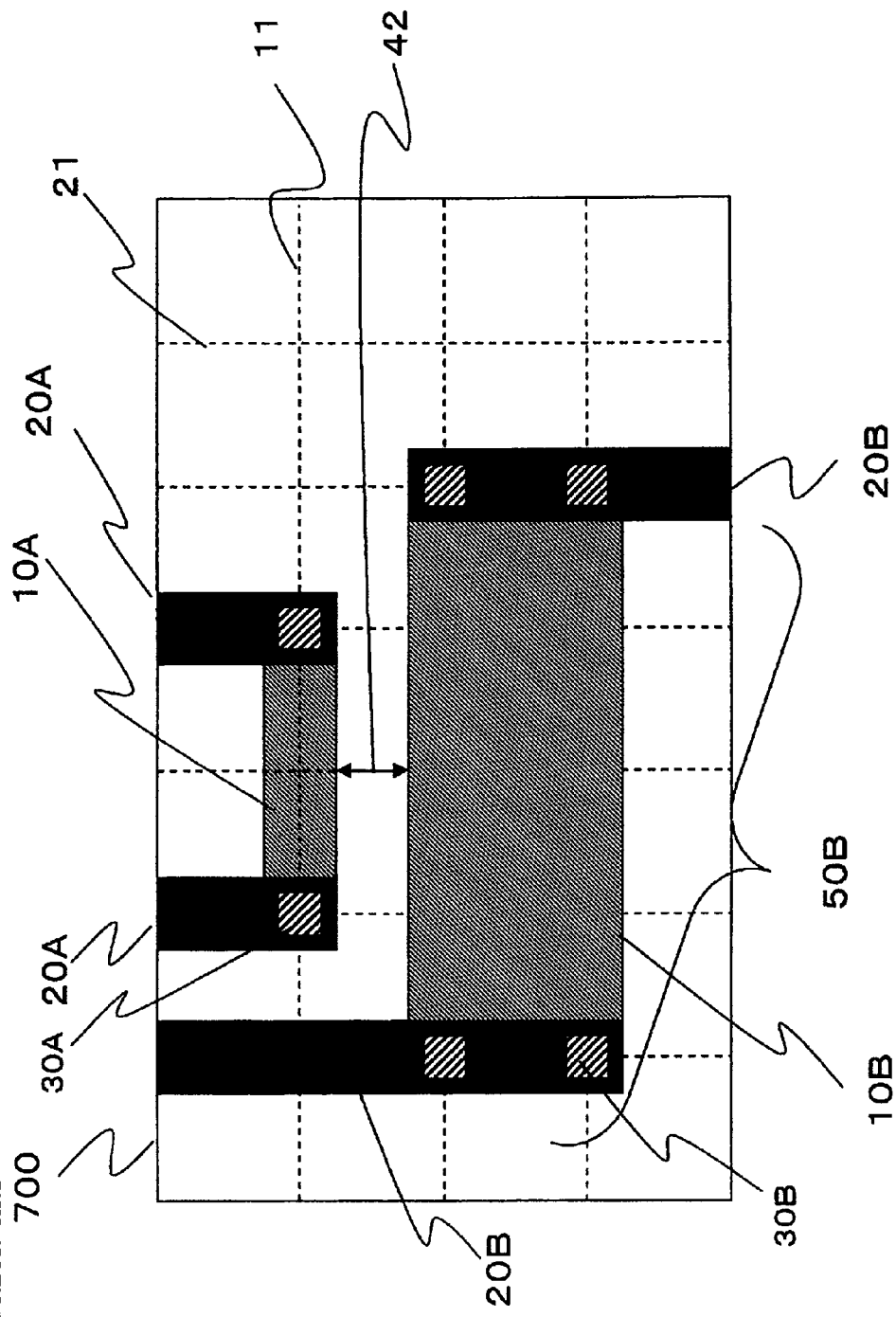
FIG. 29 is a view for explaining an increase in a wiring width according to the prior art (the Patent Document 4)
Figure 30:
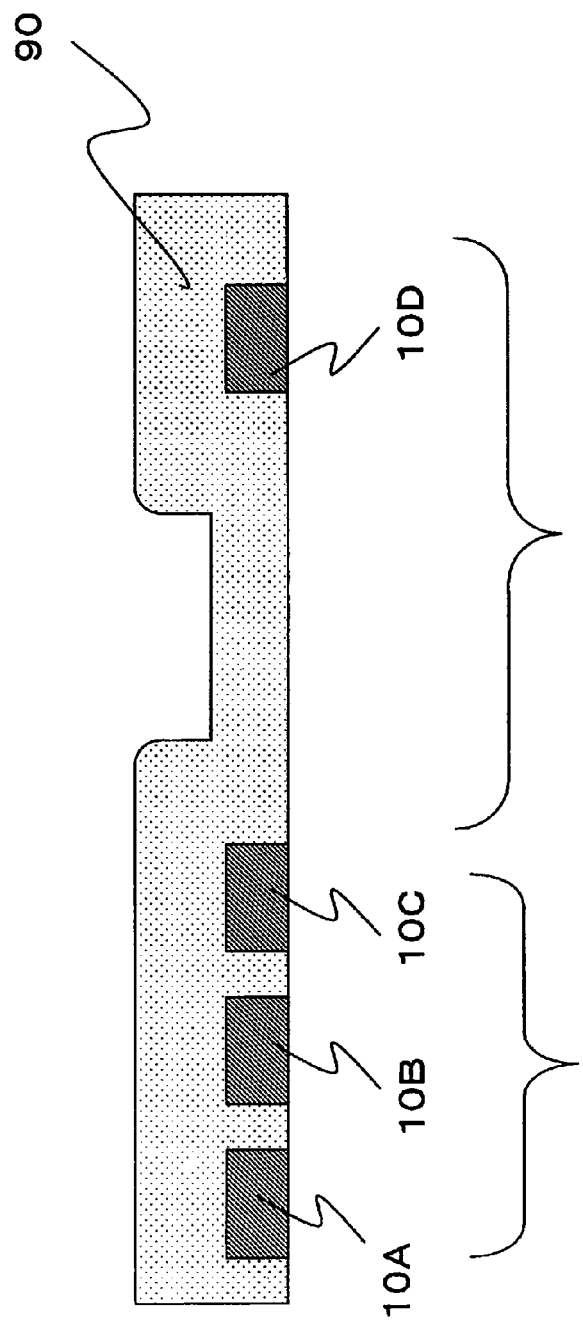
FIG. 30 is a view showing a sectional structure of a wiring.

Moreover, FIG. 25 shows only a portion related to a first layer wiring in FIG. 24.

The control portion 74 carries out the extraction processing at the empty region extracting step S2. Consequently, any of first layer wiring grid lines 11 in FIG. 25 which is not occupied by first layer wirings 10A and 10B is extracted as an empty region grid 12.

Next, the control portion 74 carries out a step of extracting any of the wiring patterns which is to be reinforced by using the wiring pattern and the information about the empty region at the reinforcing target wiring pattern extracting step S3. A wiring to be extracted as a reinforcing target has the empty region grid 12 provided around the wiring pattern. In the case in which a plurality of wiring patterns is present, a wiring pattern having a smaller width than a predetermined wiring width and a greater length than a predetermined wiring length may be extracted as a wiring pattern to be preferentially reinforced. In FIG. 25, the first layer wiring pattern 10B is extracted.

Figure 2:
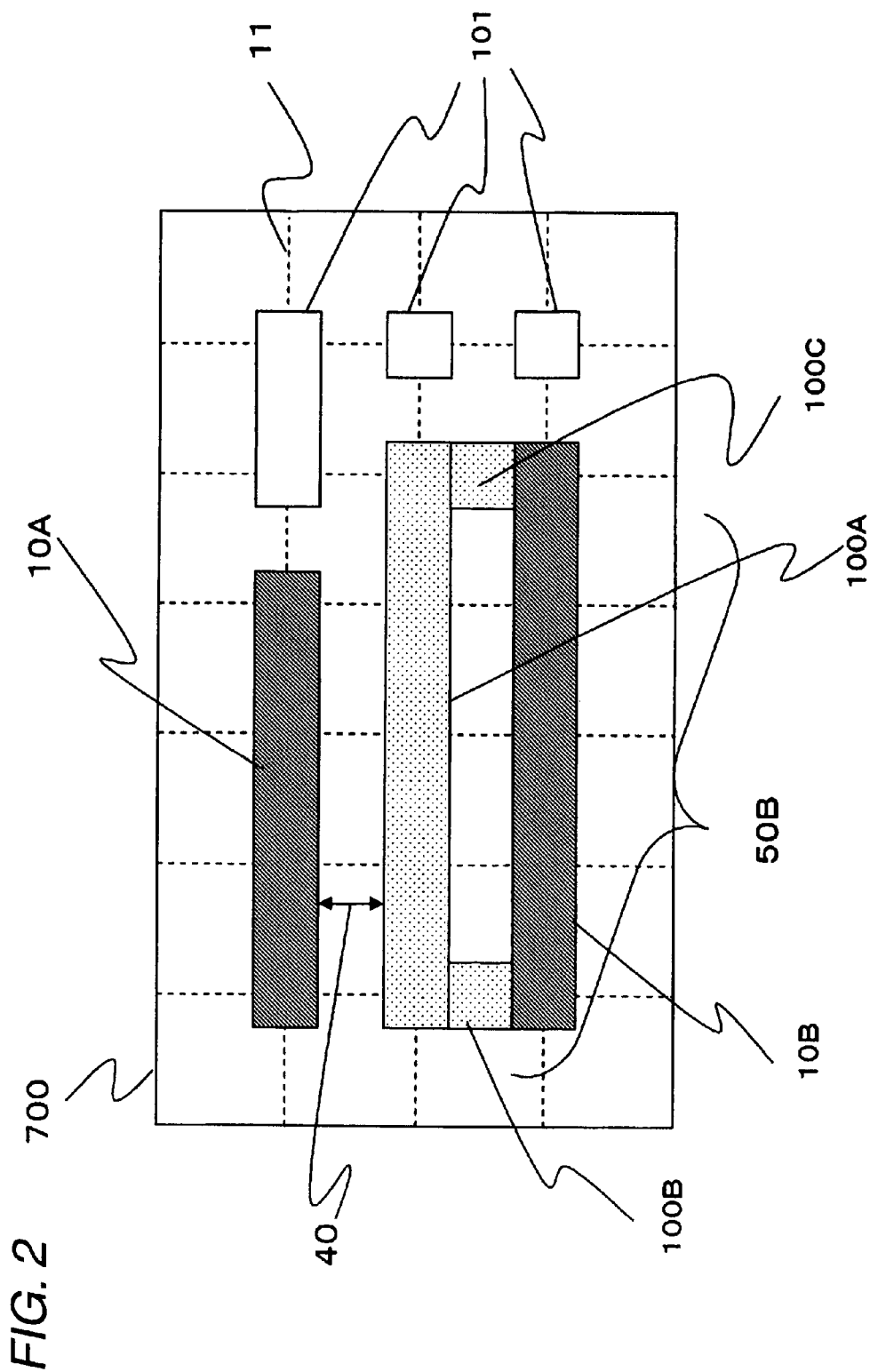
FIG. 2 is a view showing a first layer wiring reinforced pattern and dummy pattern generating result according to the first embodiment of the invention.

Subsequently, the control portion 74 generates a first layer wiring reinforced pattern 100 which takes a shape of a donut and is to be electrically connected to the reinforcing target wiring pattern 10B in accordance with the design rule in the empty region grid 12 provided around the reinforcing target wiring pattern 10B as shown in FIG. 2 at the wiring reinforced pattern generating step S4. More specifically, the wiring reinforced pattern 100 also generates wiring reinforced patterns 100B and 100C in a perpendicular direction which are to be electrically connected to the reinforcing target wiring pattern 10B in addition to a wiring reinforced pattern 100A in a horizontal direction. At this time, the existing wiring pattern 10A and the generated wiring reinforced pattern 100A are disposed to satisfy a wiring spacing 40 in accordance with the design rule. By the reinforcement, it is possible to obtain an advantage that a wiring resistance of a net 50B can be reduced.

Figure 3:
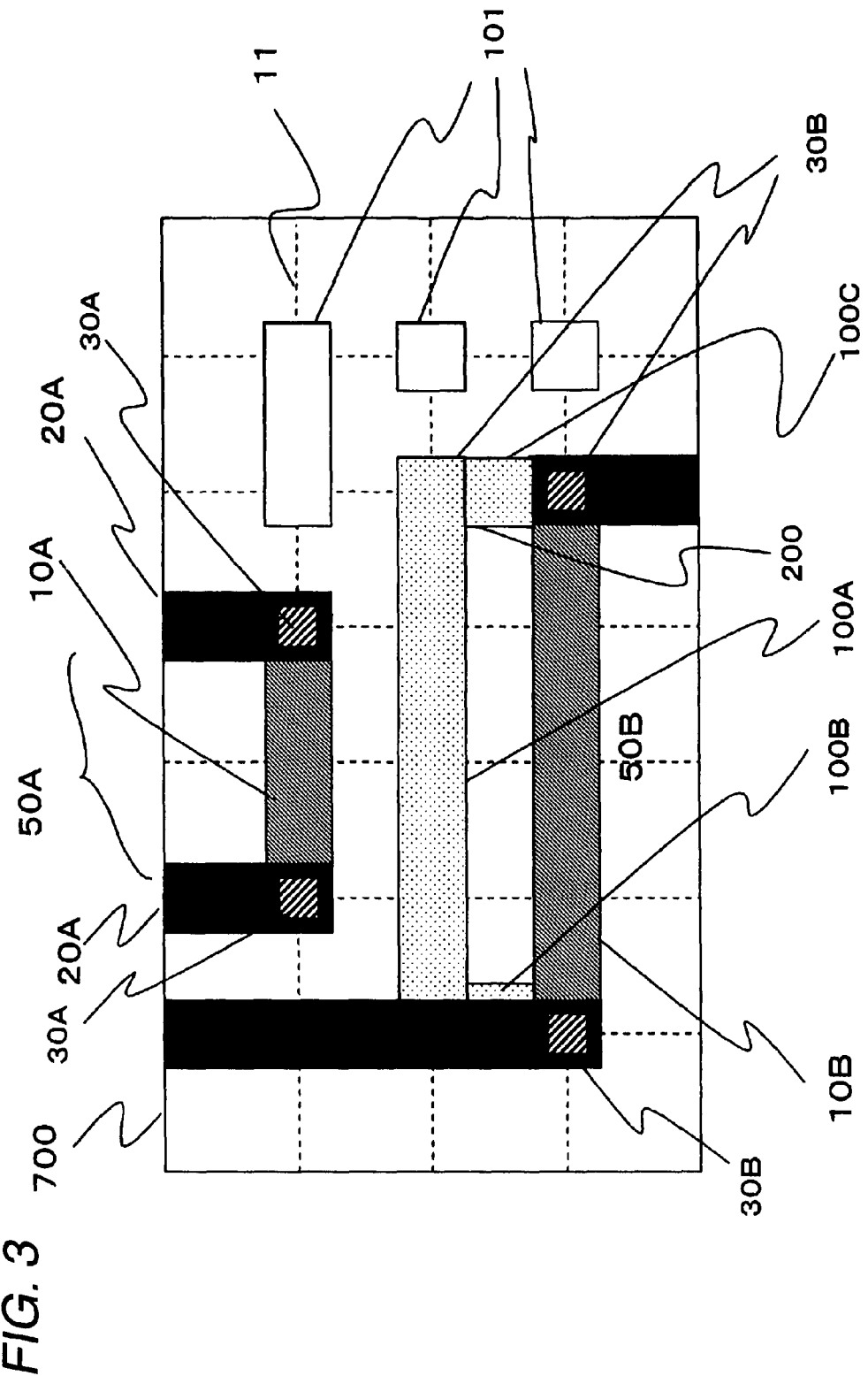
FIG. 3 is a view showing a wiring pattern designing result according to the first embodiment of the invention.

Then, the control portion 74 generates a first layer dummy pattern 101 which is not electrically connected to the wiring pattern in accordance with the design rule in the first layer empty region 12 which is not occupied after the wiring reinforced pattern generating step S4 as shown in FIG. 2 at the dummy pattern generating step S5 (FIG. 2). FIG. 3 is a view in which a via and a second wiring layer are added to FIG. 2.

Figure 14:
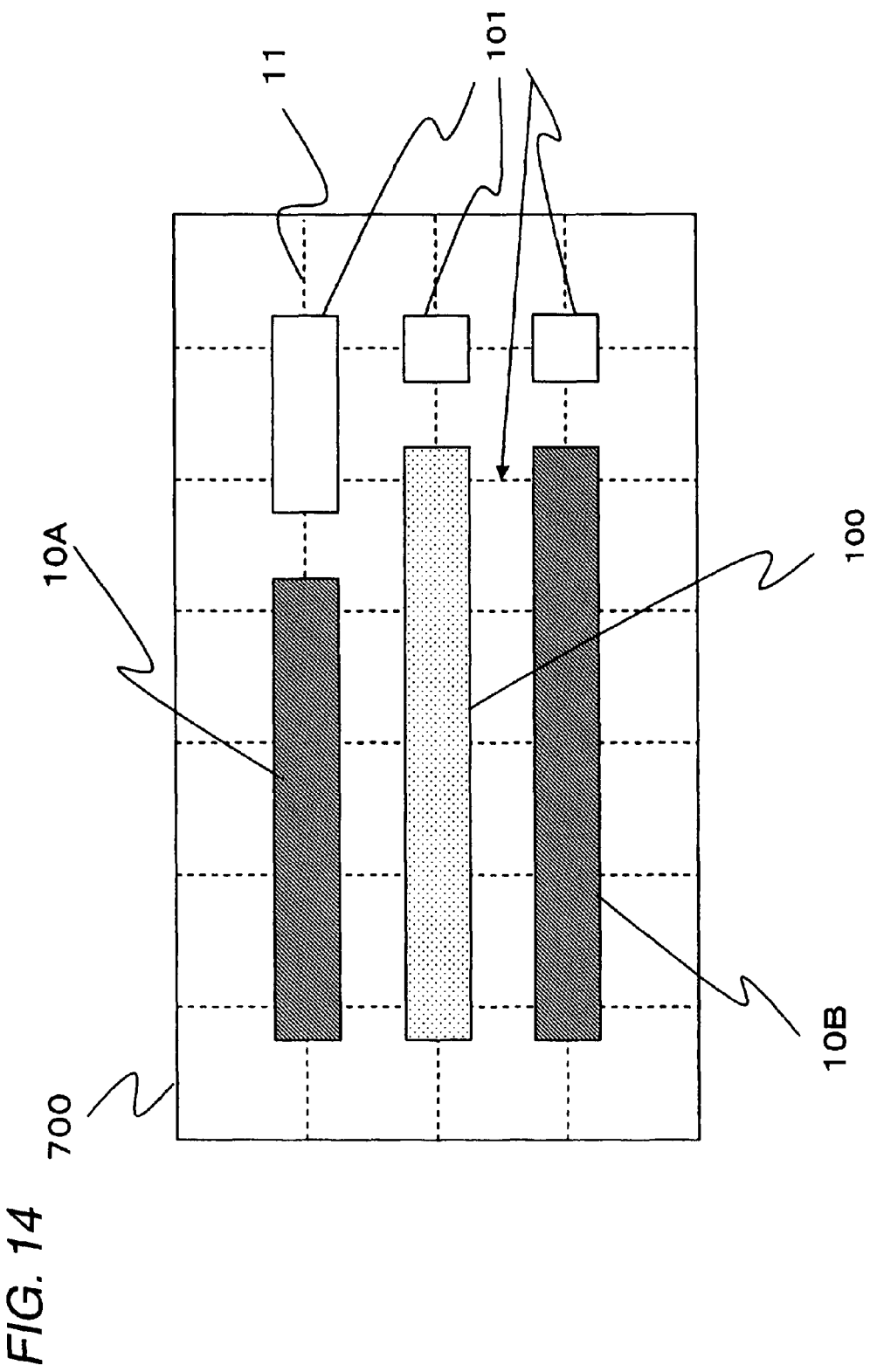
FIG. 14 is a view for explaining a wiring reinforced pattern generating step in the case in which a first layer wiring pattern is always set into only a horizontal direction according to the first embodiment of the invention.
Figure 15:
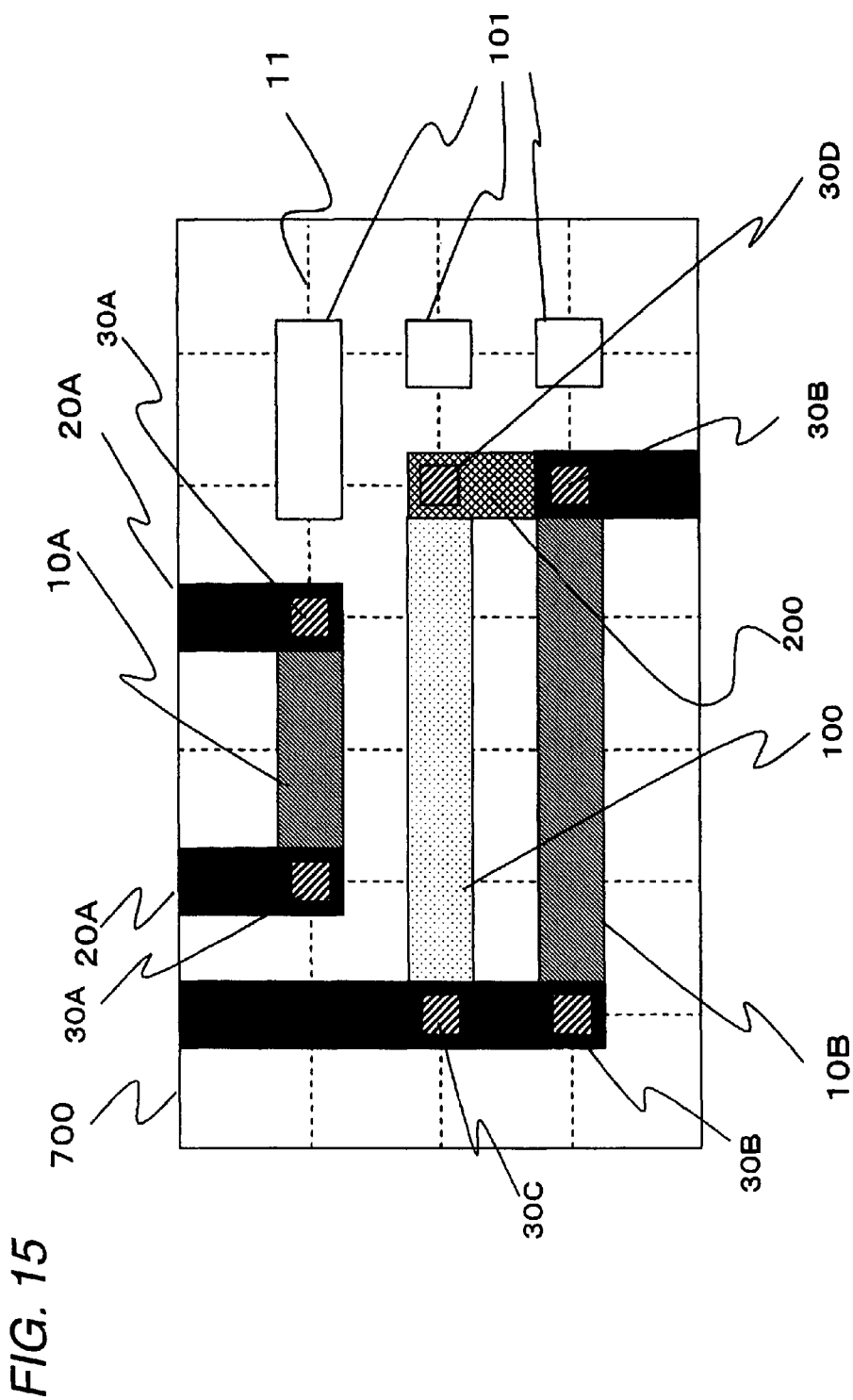
FIG. 15 is a view for explaining a step of generating a wiring reinforced pattern by using a second layer wiring in a perpendicular direction according to the first embodiment of the invention.

In a designing technique for always limiting the first layer wiring pattern into only a horizontal direction, the first layer wiring reinforced pattern 100 in the horizontal direction may be generated as shown in FIG. 14 at the wiring reinforced pattern generating step S4, and furthermore, the first layer wiring reinforced pattern 100 may be electrically connected to the reinforcing target wiring pattern 10B through a via 30D and a second layer wiring reinforced pattern 200 in a perpendicular direction as shown in FIG. 15.

Second Embodiment

A method of designing a wiring pattern of a semiconductor integrated circuit according to a second embodiment of the invention will be described below with reference to FIG. 4. Since a procedure for steps according to the second embodiment is the same as the processing procedure according to the first embodiment except for the wiring reinforced pattern generating step S4, description will be omitted.

Figure 4:
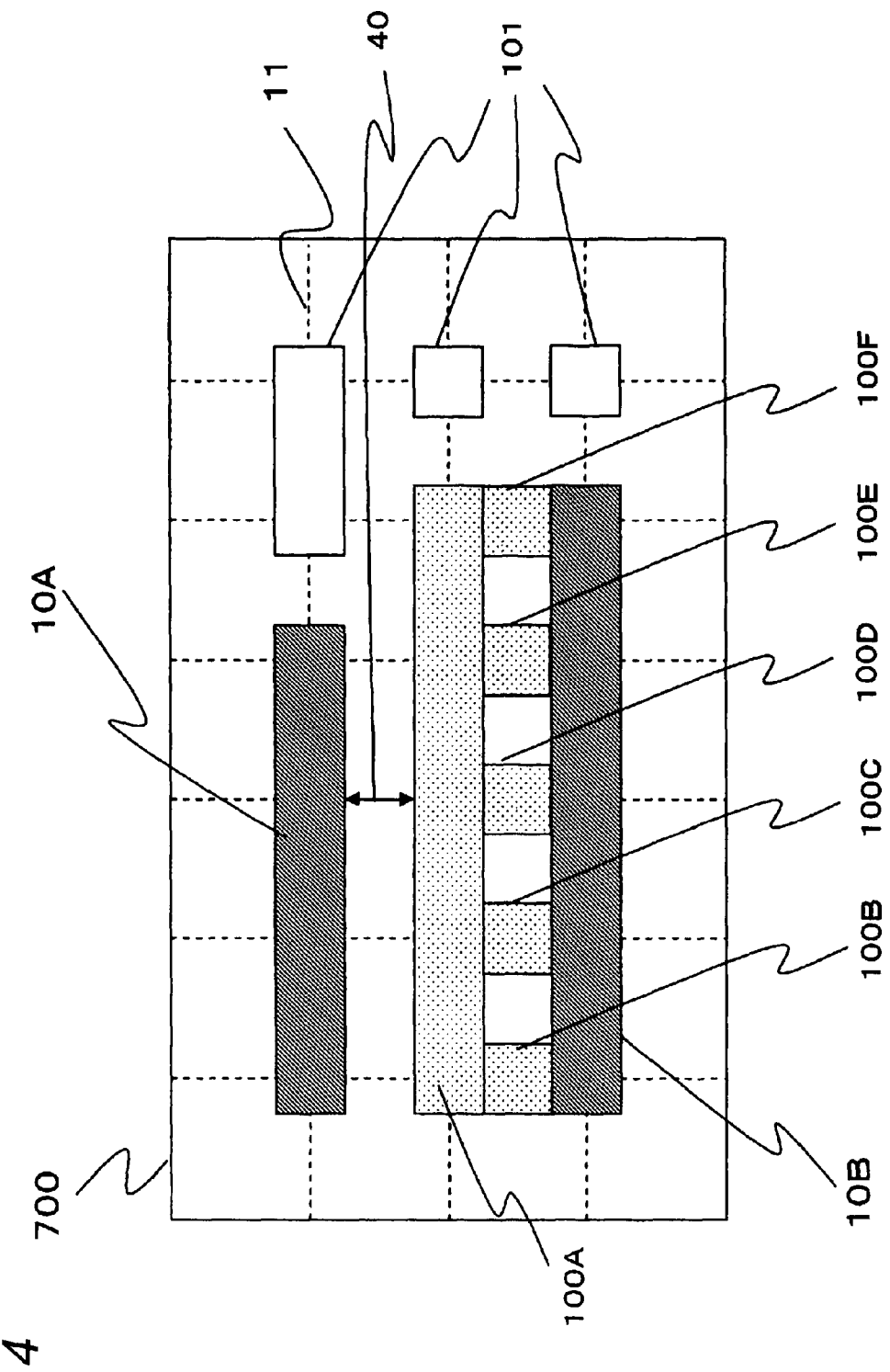
FIG. 4 is a view showing a result of a mesh-shaped wiring reinforced pattern generation and a dummy pattern generation in a first layer wiring according to a second embodiment of the invention.

At the wiring reinforced pattern generating step S4, as shown in FIG. 4, a wiring reinforced pattern which takes a shape of a mesh and is to be electrically connected to the reinforcing target wiring pattern 10B is generated in accordance with the design rule in the empty region 12 provided around the reinforcing target wiring pattern 10B. More specifically, the wiring reinforced pattern 100 generates wiring reinforced patterns 100B, 100C, 100D, 100E and 100F in a perpendicular direction which are to be electrically connected to the reinforcing target wiring pattern 10B in addition to a wiring reinforced pattern 100A in a horizontal direction. At this time, the existing wiring pattern 10A and the generated wiring reinforced pattern 100A are disposed to satisfy a wiring spacing 40 in accordance with the design rule. By the reinforcement, it is possible to obtain an advantage that a wiring resistance of a net 50B can be reduced as shown in FIG. 5.

At the dummy pattern generating step S5, next, a first layer dummy pattern 101 which is not electrically connected to the wiring pattern is generated in accordance with the design rule in the first layer empty region 12 which is not occupied after the wiring reinforced pattern generating step S4.

Figure 5:
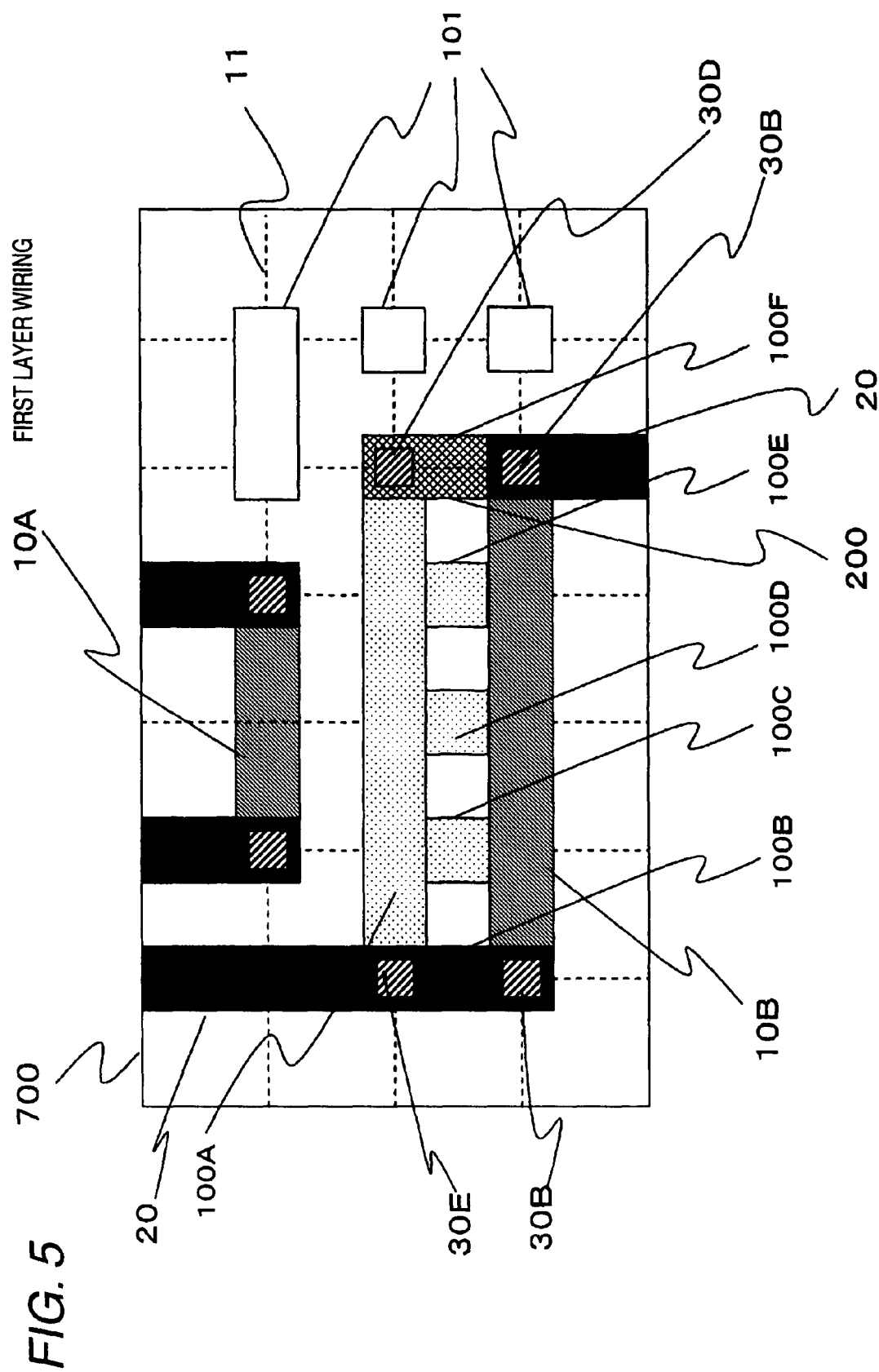
FIG. 5 is a view showing a wiring pattern designing result according to the second embodiment of the invention.

FIG. 5 is a view in which a via 30 (30B, 30D) and a second wiring layer 20 are added to FIG. 4.

As shown in FIG. 5, the vias 30B and 30D and a reinforcing wiring 200 for the second wiring layer may be added if the second wiring layer provided on the wiring reinforced pattern 100 is empty.

Third Embodiment

Figure 6:
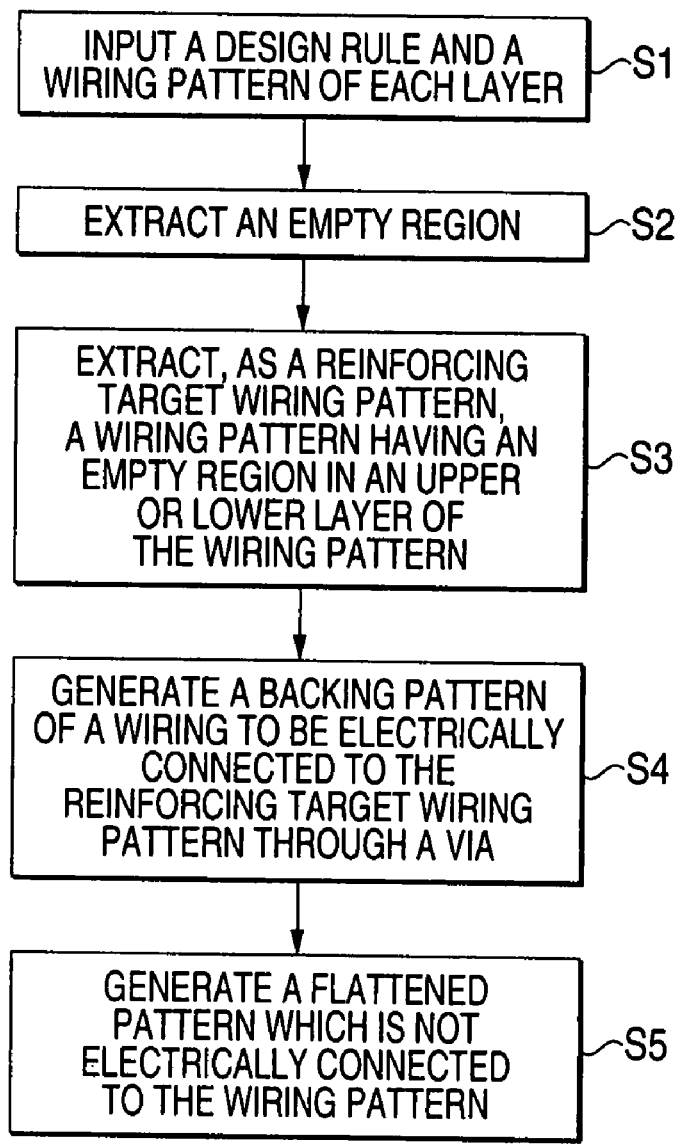
FIG. 6 is a diagram for explaining a processing procedure for a wiring pattern designing method according to a third embodiment of the invention.

Next, a method of designing a wiring pattern of a semiconductor integrated circuit according to a third embodiment of the invention will be described with reference to the drawings. FIG. 6 is a flowchart showing a processing procedure for a method of designing a layout of a semiconductor integrated circuit according to the third embodiment of the invention. An inputting step S1 is the same as that in the first embodiment. FIG. 24 shows a wiring pattern of each other which is to be input. FIG. 24 has been described in the Background Art.

Moreover, an empty region extracting step S2 to be a next step is the same as that in the first embodiment.

Figure 7:
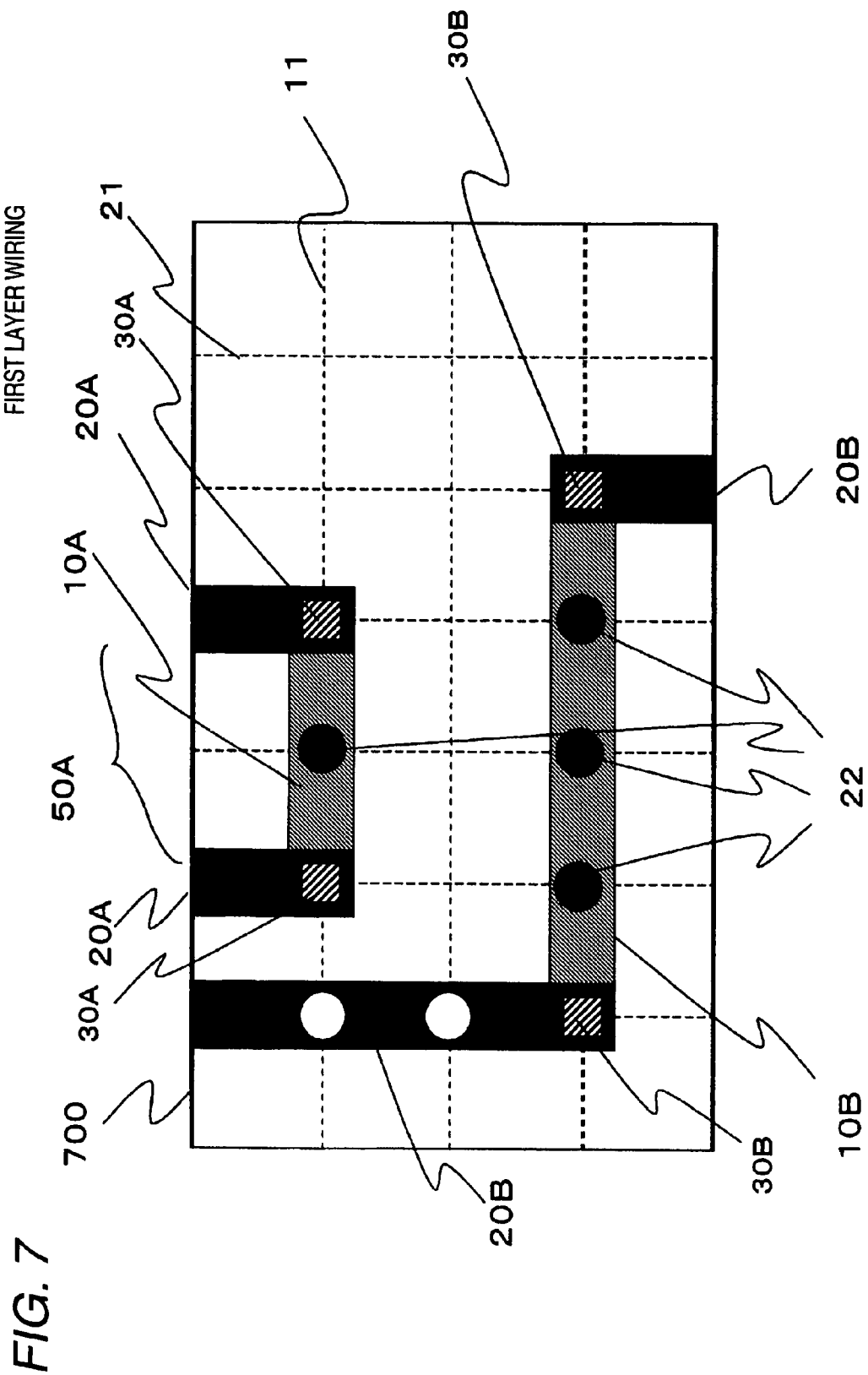
FIG. 7 is a view showing a wiring backing and dummy pattern generating result according to the third embodiment of the invention.

At a reinforcing target wiring pattern extracting step S31, then, the wiring pattern having an empty region on an upper layer or a lower layer of the wiring pattern is extracted as a wiring pattern to be reinforced by using the wiring pattern and the information about the empty region. In FIG. 7, wiring patterns 10A and 10B having a second layer empty region 22 on the first layer wiring pattern 10 are extracted as reinforcing target wiring patterns.

Next, a wiring reinforced pattern generating step S41 will be described with reference to FIG. 8.

Figure 8:
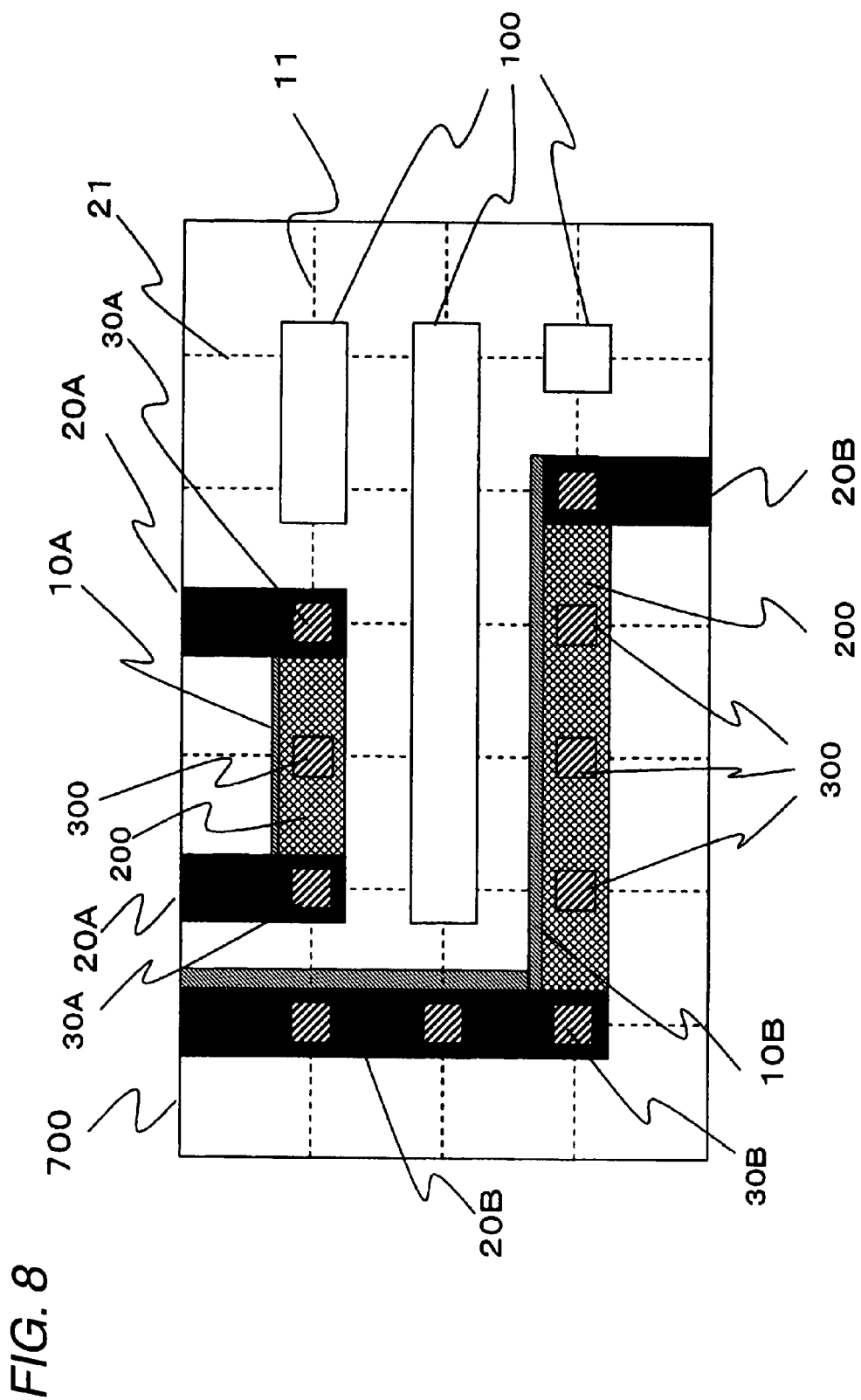
FIG. 8 is a view showing the wiring backing and dummy pattern generating result according to the third embodiment of the invention.

In FIG. 8, a backing pattern 200 for a wiring of a second wiring layer to be electrically connected to the reinforcing target wiring patterns 10A and 10B through a via 300 in accordance with a design rule is generated in the second wiring layer empty region 22 provided on the reinforcing target wiring patterns 10A and 10B. Consequently, it is possible to obtain an advantage that a wiring resistance can be reduced. A next dummy pattern generating step S8 is the same as that in the first embodiment.

Fourth Embodiment

A method of designing a wiring pattern of a semiconductor integrated circuit according to a fourth embodiment of the invention will be described below with reference to the drawings.

Figure 17:
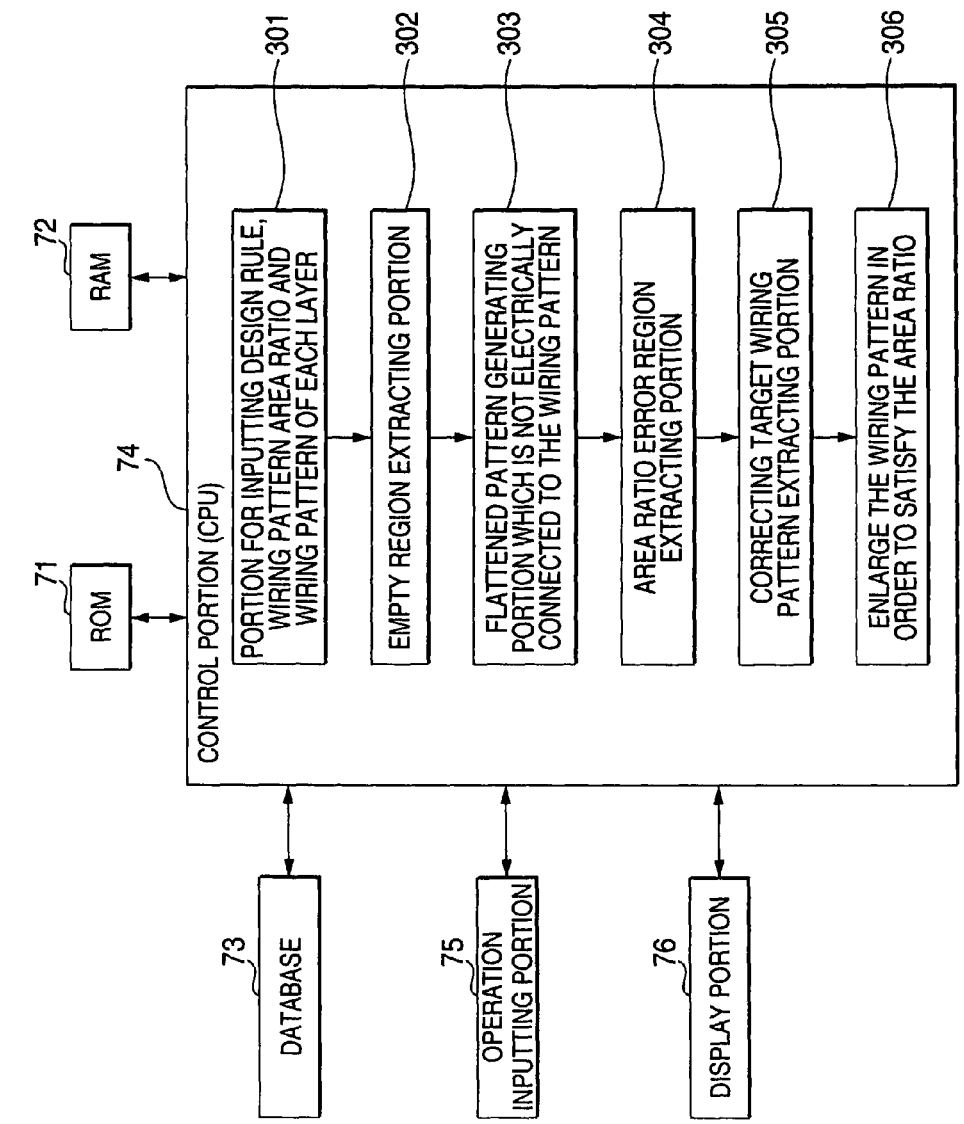
FIG. 17 is a block diagram showing a structure of a wiring pattern designing apparatus according to the fourth embodiment of the invention.

FIG. 17 is a block diagram showing an example of a structure of a main part in a wiring pattern designing apparatus for a semiconductor integrated circuit according to the fourth embodiment of the invention. In FIG. 17, a wiring pattern designing apparatus 70 comprises an ROM 71 to be a first storing portion (a readable recording medium) in which a control program and data for a wiring pattern design are stored, an RAM 72 to be a second storing portion functioning as a work memory, a database 73 in which various data for the wiring pattern design are stored, an operation inputting portion 75 capable of causing a user to input various operation commands (including a starting or end command of the wiring pattern design), a display portion 76 capable of displaying various screen information such as an initial screen for the wiring pattern design, and a control portion 74 for controlling each portion based on the control program and the data, and supports the wiring pattern design.

More specifically, in the apparatus, the control portion 74 includes an inputting portion 301 for reading layout data and a design rule from the database 73 and using the control program read from the ROM 71, the operation inputting portion 75 and the display portion 76 to input the design rule, a wiring pattern area ratio of each layer, and a wiring pattern of each layer, an empty region extracting portion 302 fir extracting an empty region in which the wiring pattern is not present, a dummy pattern generating portion 303 for generating a dummy pattern which is not electrically connected to the wiring pattern in accordance with the design rule in the empty region, a wiring pattern area ratio error region extracting portion 304 for calculating a wiring pattern area ratio in each layer and extracting a wiring region which does not satisfy the wiring pattern area ratio of each layer which is set, a correcting target wiring pattern extracting portion 305 for extracting the wiring pattern which satisfies a condition that an interval between the wiring patterns is greater than a minimum value of the design rule and is too small to generate the dummy pattern therebetween in the wiring pattern area ratio error region, and a wiring pattern correcting portion 306 for enlarging the correcting target wiring pattern in accordance with the design rule in order to satisfy the wiring pattern area ratio.

By the structure, the operation will be described below.

Figure 9:
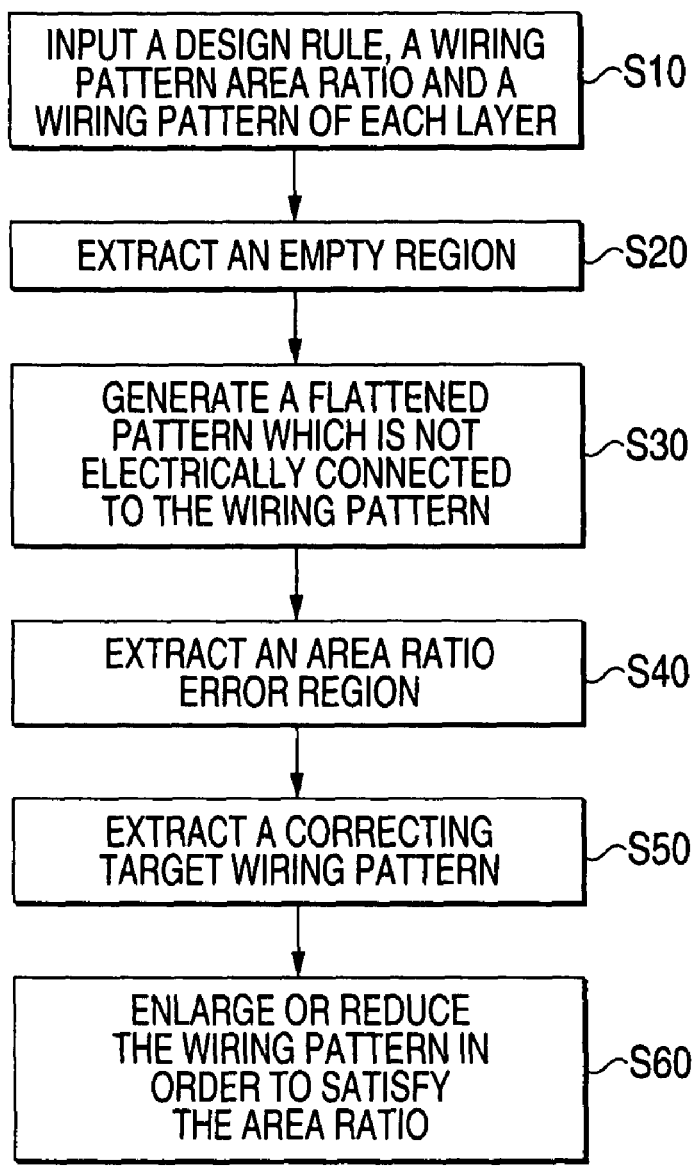
FIG. 9 is a flowchart showing a processing procedure for a wiring pattern designing method according to a fourth embodiment of the invention.

FIG. 9 is a flowchart showing a processing procedure for the method of designing a layout of a semiconductor integrated circuit according to the fourth embodiment of the invention.

In FIG. 9, at an inputting step S10, a preset design rule, a wiring pattern area ratio of each layer which is preset, and a wiring pattern of each layer are input.

Figure 10:
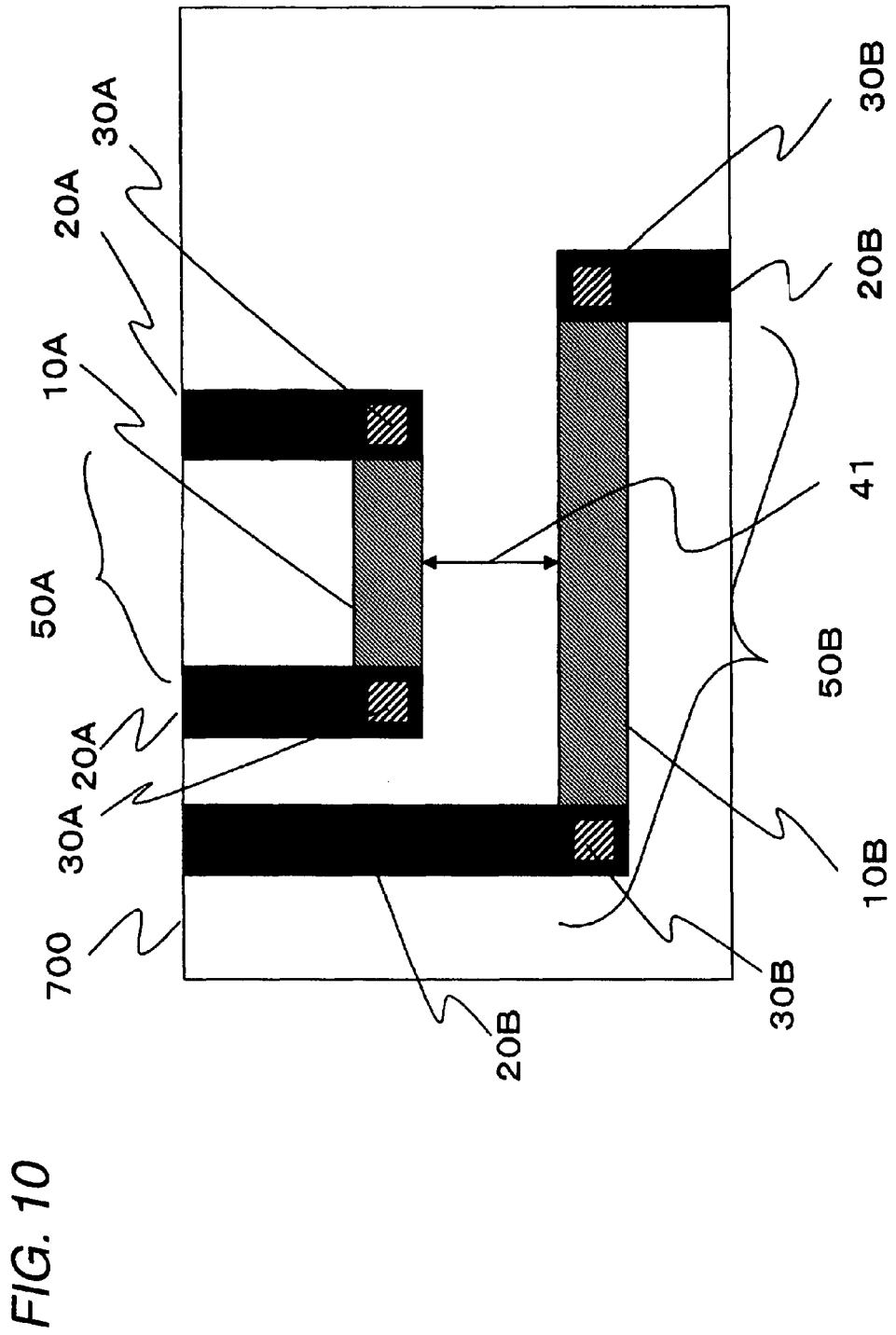
FIG. 10 is a view for explaining a wiring pattern to be input according to the fourth embodiment of the invention.

FIG. 10 shows the wiring pattern of each layer which is to be input.

In a semiconductor integrated circuit apparatus 700, wiring patterns of a first layer wiring 10 and a second layer wiring 20 which are vertically adjacent to each other are shown. Moreover, description will be given on the assumption that the first layer wiring pattern 10 preferentially uses a horizontal direction and the second layer wiring pattern 20 preferentially uses a perpendicular direction.

The first layer wiring pattern 10 and the second layer wiring pattern 20 are connected to each other through a via 30. 50 denotes a net to be wired at an equal electric potential. In FIG. 10, two nets 50A and 50B are shown.

FIG. 10 is different from FIG. 24 in that a wiring does not need to be provided on a grid line. For this reason, it is sufficient that an interval 41 between first layer wirings is equal to or greater than a predetermined minimum wiring spacing to be a design rule.

Figure 11:
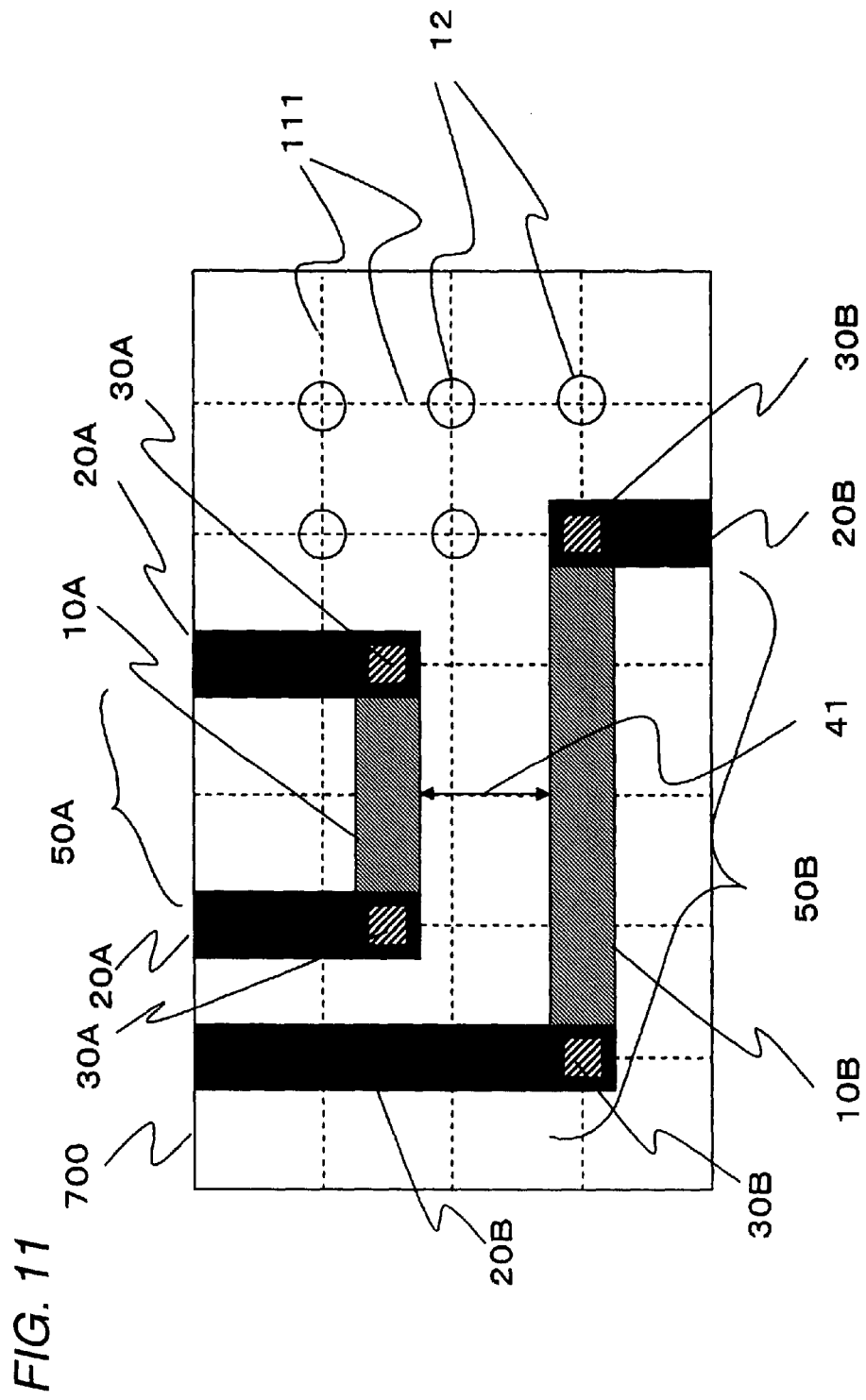
FIG. 11 is a view for explaining an empty region extraction according to the fourth embodiment of the invention.

At an empty region extracting step S20, next, an empty region in which the wiring pattern is not present is extracted. For example, as shown in FIG. 11, a dummy pattern generating grid line 111 having an interval of a dummy pattern which is generated at a subsequent dummy pattern generating step S30 is provided on the semiconductor integrated circuit apparatus 700. Consequently, it is possible to apply the same step as the empty region extracting step S2 according to the first embodiment. A first layer wiring grid line 111 which is not occupied by the first layer wirings 10A and 10B in the first layer dummy pattern generating grid lines 111 in FIG. 11 is extracted as an empty region 12.

It is assumed that the wiring space 41 between the first layer wirings is too small to generate a dummy pattern in a region interposed between the first layer wirings 10A and 10B. Consequently, the region interposed between the first layer wirings 10A and 10B is not extracted as the empty region grid 12.

Figure 12:
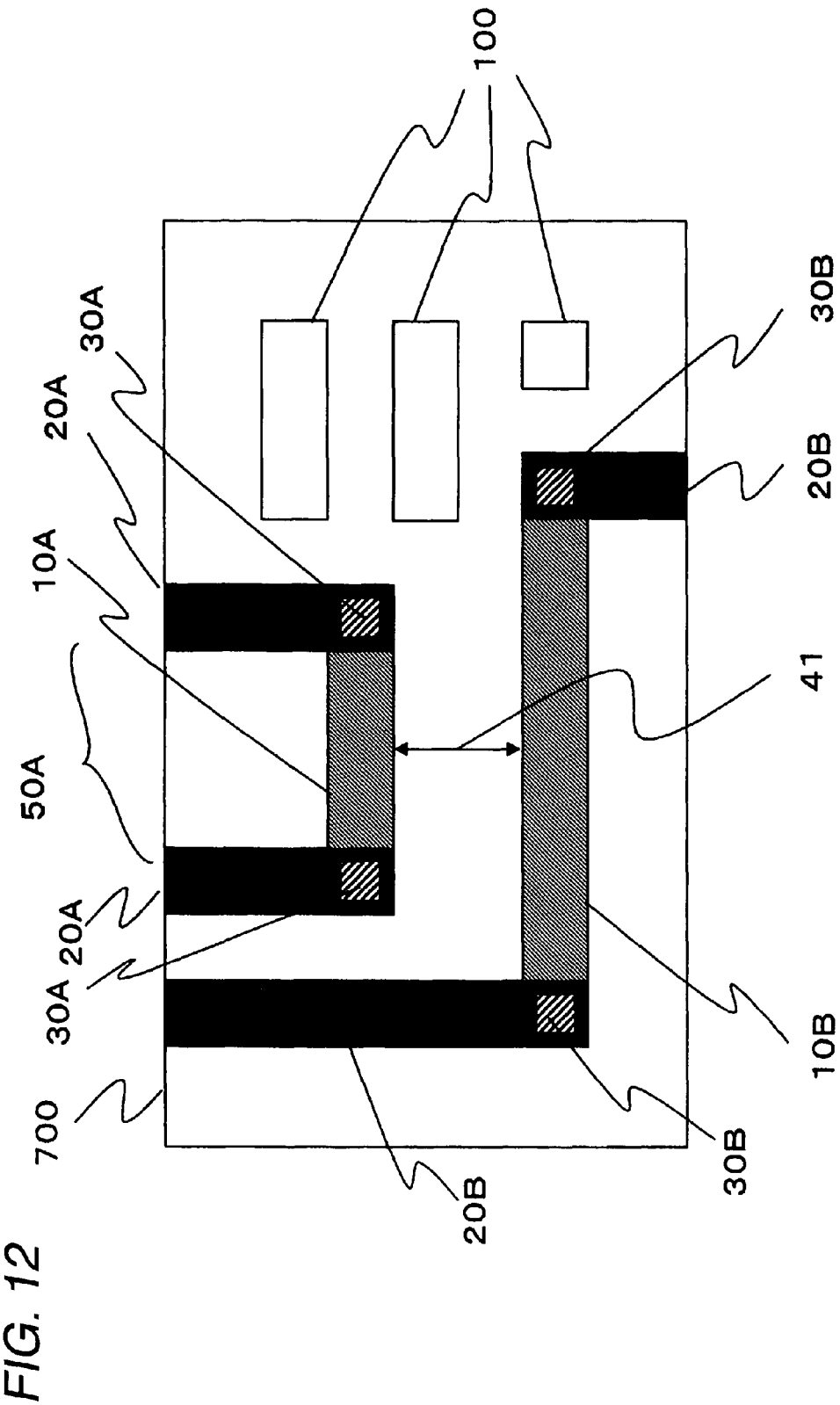
FIG. 12 is a view showing a dummy pattern generating result according to the fourth embodiment and a fifth embodiment of the invention.

For the dummy pattern generating step S30, next, it is possible to use the same step as the dummy pattern generating step S5 according to the first embodiment. FIG. 12 shows a result obtained after generating the dummy pattern.

At a wiring pattern area ratio error region extracting step S40, subsequently, a wiring pattern area ratio in each layer is calculated and a wiring region which does not satisfy the input wiring pattern area ratio of the layer is extracted.

Figure 13:
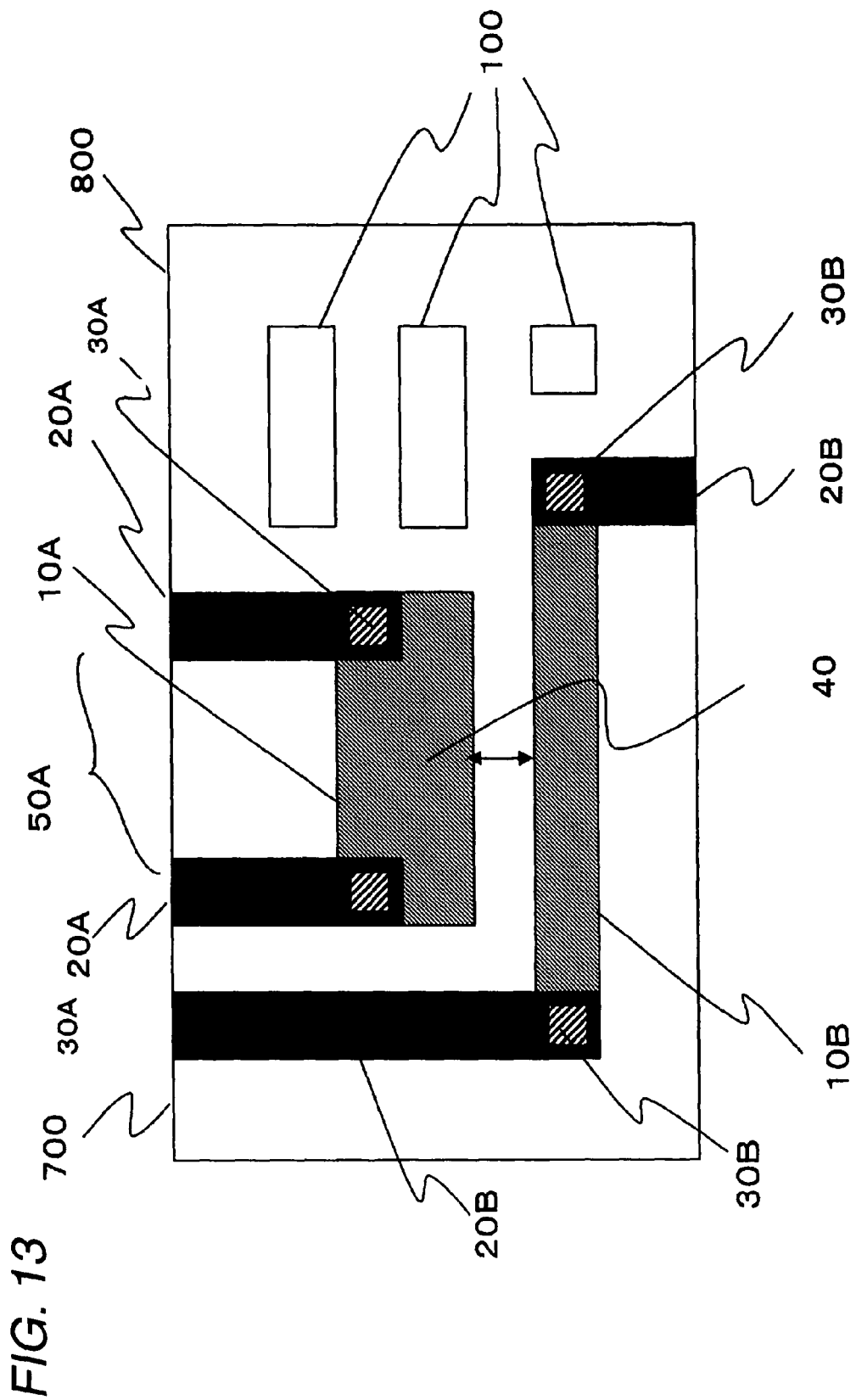
FIG. 13 is a view showing a result of a wiring correcting step according to the fourth and fifth embodiments of the invention.

It is assumed that a region 800 shown in FIG. 13 is extracted as a first layer wiring pattern area ratio error region 800 which has a lower area ratio than a predetermined area ratio.

At a correcting target wiring pattern extracting step S50, next, any of wiring patterns in the wiring pattern area ratio error region which satisfies a condition that an interval between the wiring patterns is greater than a minimum value of the design rule and is too small to generate the dummy pattern therebetween is extracted from the wiring patterns.

In FIG. 11, 10A is extracted as a wiring pattern to be corrected from the first layer wiring patterns 10A and 10B in the first layer wiring pattern area ratio error region 800.

At a wiring pattern correcting step, subsequently, a width of a correcting target wiring pattern is increased or reduced in accordance with the design rule in order to satisfy a wiring pattern area ratio. In FIG. 12, a wiring width of the first layer wiring pattern 10A is increased within such a range that the interval 41 between the first layer wiring patterns 10A and 10B satisfies the design rule. A result is shown in FIG. 13. A distance between the first layer wiring patterns 10A and 10B is represented as a minimum interval 40. Consequently, a dummy pattern cannot be inserted between the first layer wiring patterns 10A and 10B. By increasing a width of the wiring itself, however, it is possible to increase an area occupied by the wiring, thereby improving an area ratio.

Fifth Embodiment

Figure 18:
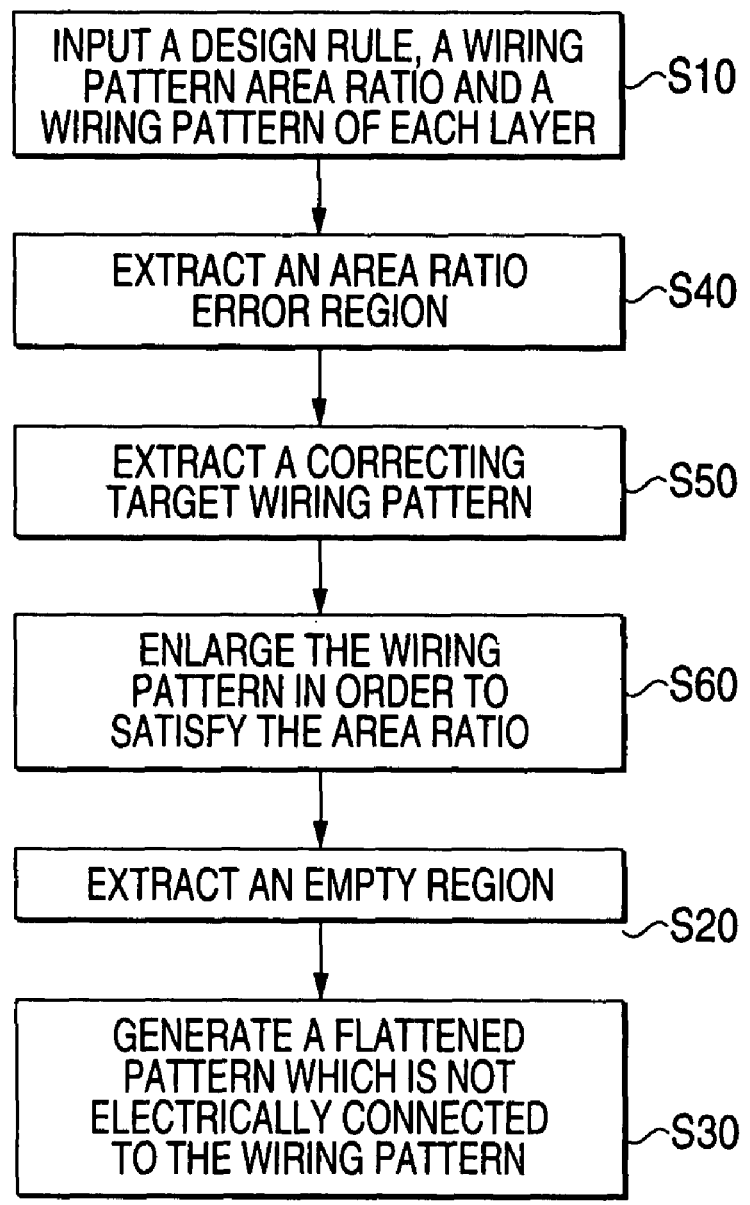
FIG. 18 is a flowchart showing a processing procedure for a wiring pattern designing method according to the fifth embodiment of the invention.

A method of designing a layout of a semiconductor integrated circuit according to a fifth embodiment of the invention will be described with reference to the drawings. FIG. 18 is a flowchart showing a processing procedure for the method of designing a layout of a semiconductor integrated circuit according to the fifth embodiment of the invention.

In FIG. 18, at an inputting step 810, a preset design rule, a wiring pattern area ratio of each layer which is preset and a wiring pattern of each layer are input.

FIG. 10 shows a wiring pattern of each layer which is to be input.

FIG. 10 is the same as that described in the fourth embodiment.

At a wiring pattern area ratio error region extracting step S40, next, a wiring pattern area ratio in each layer is calculated and a wiring region which does not satisfy the wiring pattern area ratio of each layer which is input is extracted.

It is assumed that a region 800 shown in FIG. 13 is extracted as a first layer wiring pattern area ratio error region 800 which has a lower area ratio than a predetermined area ratio.

At a correcting target wiring pattern extracting step S50, next, any of wiring patterns in a wiring pattern area ratio error region which satisfies a condition that an interval between the wiring patterns is greater than a minimum value of the design rule and is too small to generate the dummy pattern therebetween is extracted as a wiring pattern to be corrected from the wiring patterns. The reason is as follows. At a subsequent dummy pattern generating step S30, referring to a wiring provided in a region in which it is hard to improve an area ratio, it is possible to enhance an area ratio by changing a width of the wiring itself.

In FIG. 11, it is assumed that 10A is extracted as a wiring pattern to be corrected.

At a wiring pattern correcting step S60, subsequently, there is corrected a wiring pattern in which a width of a correcting target wiring pattern is increased in accordance with the design rule in order to satisfy the wiring pattern area ratio.

In FIG. 12, a wiring width of the first layer wiring pattern 10A is increased within such a range that an interval 41 between the first layer wiring patterns 10A and 10B satisfies the design rule. A result is shown in FIG. 13. A distance between the first layer wiring patterns 10A and 10B is represented as a minimum interval 40. By increasing a width of the wiring itself, it is possible to increase an area occupied by the wiring and to improve the area ratio.

At an empty region extracting step S20, next, it is possible to use the same step as that in the fourth embodiment. At the dummy pattern generating step S30, subsequently, it is possible to use the same step as the dummy pattern generating step S5 according to the first embodiment. FIG. 13 shows a result obtained after generating a dummy pattern.

Sixth Embodiment

Figure 19:
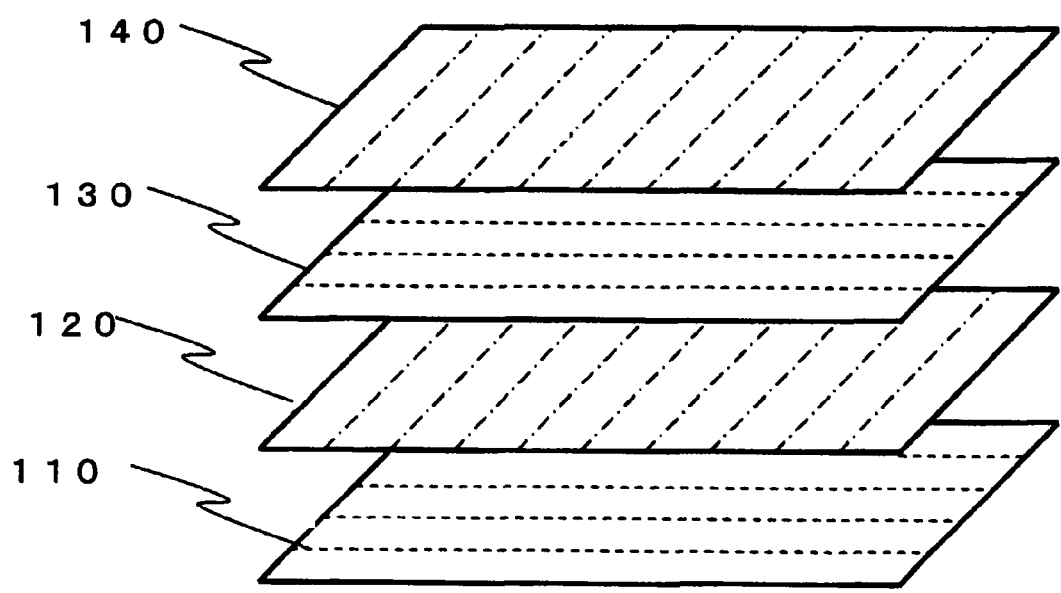
FIG. 19 is a view showing an example of a wiring model of a multilayer wiring.

A semiconductor integrated circuit apparatus according to a sixth embodiment of the invention will be described below with reference to the drawings. FIG. 19 shows an example of a wiring model of a multilayer wiring. 110, 120, 130 and 140 denote a wiring layer, respectively. 110 and 130 denote a wiring layer which preferentially uses a wiring in a transverse direction, and 120 and 140 denote a wiring layer which preferentially uses a wiring in a longitudinal direction. In each of the wiring layers, a plurality of signal wirings and a plurality of dummy patterns are disposed in parallel with each other at regular intervals. The intervals between the signal wirings and the dummy patterns may be varied every wiring layer.

Next, the semiconductor integrated circuit apparatus according to the sixth embodiment of the invention will be described with reference to FIG. 20.

First of all, FIG. 20(a) is a typical view showing a planar structure of a first wiring layer of the semiconductor integrated circuit apparatus and FIG. 20(b) shows a sectional structure taken along an A-A' line in FIG. 20(a).

The semiconductor integrated circuit apparatus has such a structure that a plurality of signal wirings 10 having an equal width and a plurality of dummy patterns 101 having an equal width are disposed in parallel with each other at regular intervals on a first wiring layer 110 provided on a semiconductor substrate 80 and at least two of the signal wirings 10 which are adjacent to each other are connected electrically to each other and are thus formed.

In FIG. 20(a), the signal wirings 10 and the dummy patterns 101 are disposed in parallel with each other at the regular intervals, and signal wirings 10B and 10C which are parallel with each other and are adjacent to each other are electrically connected to each other through wirings 10P and 10T on the same wiring layer as the signal wirings 10B and 10C at both ends of a section in which the signal wirings 10B and 10C are provided in parallel with each other, and furthermore, are electrically connected to each other through wirings 10Q, 10R and 10S also in a middle of the section in which the wirings 10B and 10C are provided in parallel with each other. In the first wiring layer, moreover, the dummy pattern 101 is formed in a region in which the signal wiring 10 is not formed.

In FIG. 20(a), the dummy pattern 101 takes a rectangular shape, the dummy pattern has an equal width to the width of the signal wiring 10, and the signal wiring 10 and the dummy pattern 101 are disposed in parallel with each other at the regular intervals.

Figure 21:
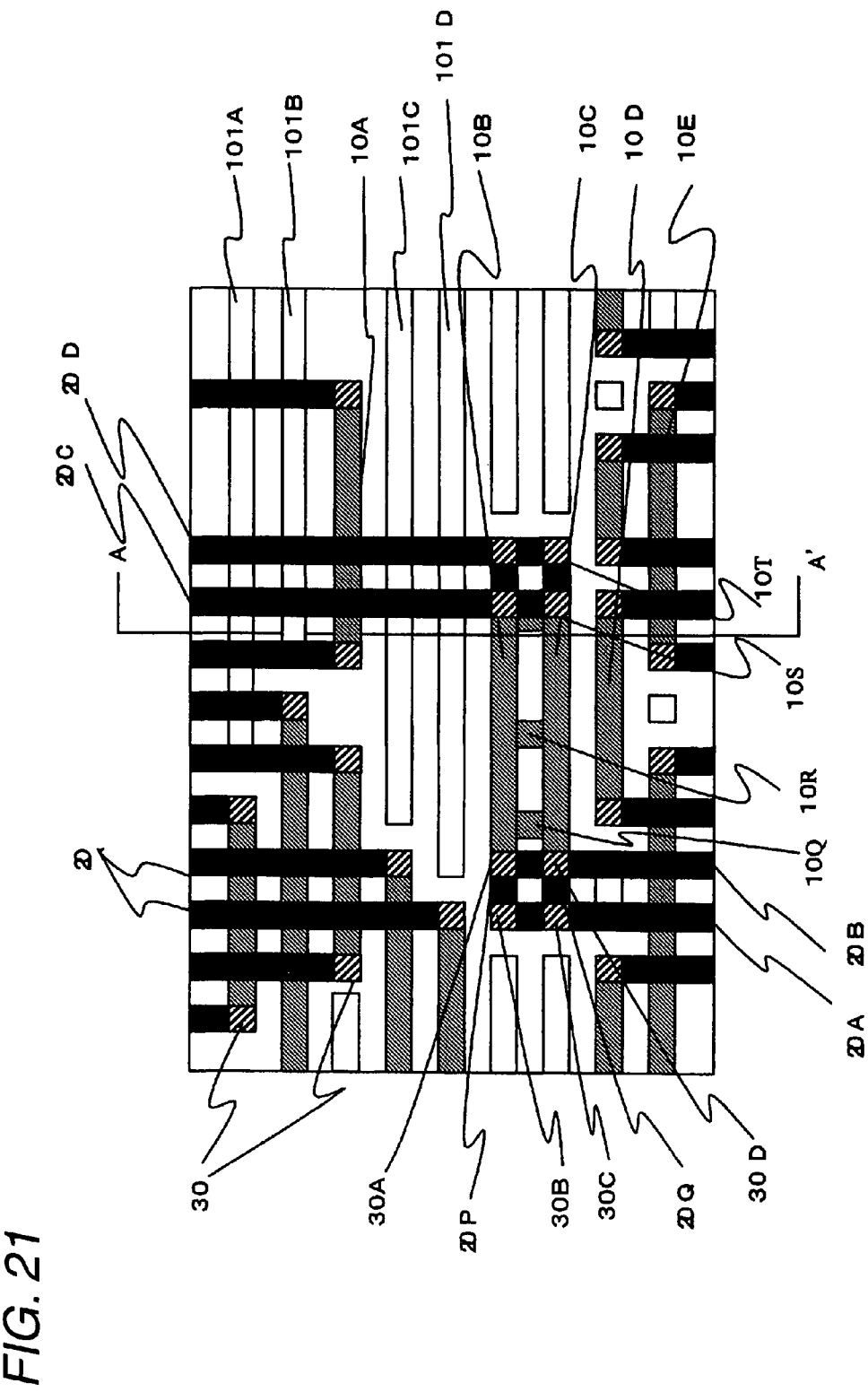
FIG. 21 is a typical view illustrating a wiring pattern of a second wiring layer which is superposed on a typical view showing a planar structure of a first wiring layer in the semiconductor integrated circuit apparatus according to the sixth embodiment of the invention.
Figure 23:
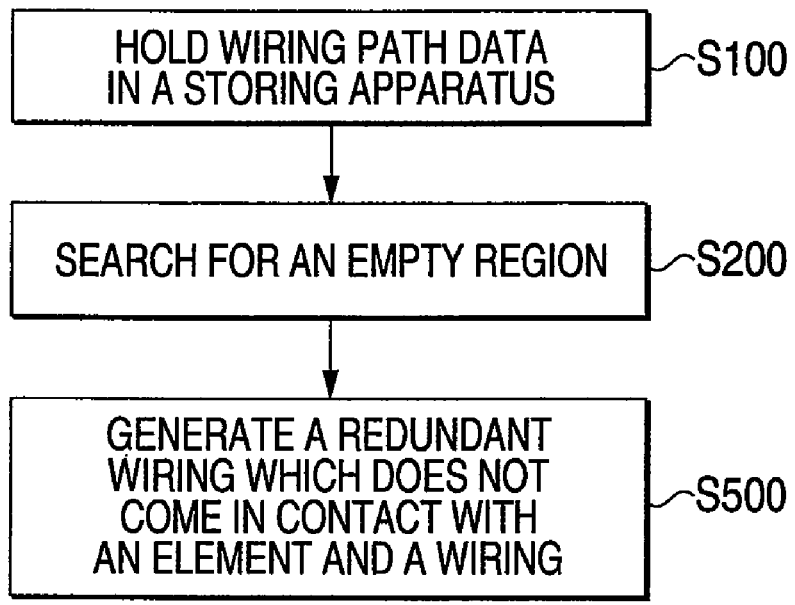
FIG. 23 is a flowchart showing a flow of a step in a conventional automatic wiring method.

FIG. 21 is a typical view showing a planar structure of the first wiring layer of the semiconductor integrated circuit apparatus in FIG. 20(a), illustrating wiring patterns of a second wiring layer which are superposed.

A plurality of signal wirings 20 having an equal width and a plurality of dummy patterns having an equal width which are disposed in parallel with each other at regular intervals are provided on the second wiring layer 120. In FIG. 21, a dummy pattern of the second wiring layer is omitted.

The signal wirings 10B and 10C of the first wiring layer are electrically connected to signal wirings 20A and 20B of the second wiring layer through vias 30A, 30B, 30C and 30D.

Moreover, the signal wirings 20A and 20B of the second wiring layer are parallel with each other and are adjacent to each other, and are electrically connected to each other through wirings 20P, 20O, 20R and 20S on the same layer as the signal wirings 20A and 20B.

A first method of manufacturing the semiconductor integrated circuit apparatus according to the sixth embodiment will be described below with reference to FIG. 20.

First of all, a first wiring layer 110 including a plurality of signal wirings 10 having an equal width and a plurality of dummy patterns 101 having an equal width is formed on a semiconductor substrate 80 as shown in FIG. 20(a). At least two of the signal wirings which are adjacent to each other are electrically connected to each other.

Next, an interlayer insulating film 90 is formed over a whole surface of the first wiring layer 110 as shown in FIG. 20(b).

The dummy pattern 101 of the first wiring layer is formed in a region in the first wiring layer 110 in which a first wiring pattern 10 is not provided. Therefore, the interlayer insulating film 90 is almost flat and a slight concavo-convex portion is generated on an upper surface of the interlayer insulating film 90 depending on the presence of the wiring pattern 10 and the dummy pattern 101 which are provided under the interlayer insulating film 90.

Subsequently, an upper part of the interlayer insulating film 90 is polished by a chemical mechanical polishing method (CMP) and the upper surface of the interlayer insulating film 90 is thus flattened completely as shown in FIG. 20(c). Then, a wiring pattern 20 of a second wiring layer is formed on the flattened interlayer insulating film 90, which is not shown.

In order to evaluate the first method of manufacturing the semiconductor integrated circuit apparatus according to the sixth embodiment, a method of manufacturing a semiconductor integrated circuit apparatus according to the conventional art will be described below with reference to FIG. 31.

A first method of manufacturing a semiconductor integrated circuit apparatus according to the conventional art serves to form a wiring pattern 10 of a first wiring layer and a dummy pattern 101 on a semiconductor substrate 80 by using the method described in the Patent Document 1, for example, and to then form an interlayer insulating film 90 on the wiring pattern 10 of the first wiring layer as shown in FIG. 31(b). In a region in which the first layer wiring pattern 10 is not formed, a first layer dummy pattern 101 is formed. Therefore, an upper surface of the interlayer insulating film 90 can be almost flattened, which is the same as the advantage obtained in the sixth embodiment.

However, the signal wiring 10 has only one small wiring width. For this reason, it is hard to reduce a wiring resistance any more except for a decrease in a wiring length.

As is apparent from a comparison between FIGS. 20 and 31, in the sixth embodiment, at least two signal wirings which are adjacent to each other are electrically connected to each other over the same wiring layer. Therefore, the wiring resistance can be reduced, and furthermore, a degree of freedom of a layout design can be obtained.

A second method of manufacturing a semiconductor integrated circuit apparatus according to the sixth embodiment will be described below with reference to FIG. 22.

FIG. 22(a) is a typical view showing a planar structure of a first wiring layer of the semiconductor integrated circuit apparatus, and FIGS. 22(b), 22(c) and 22(d) show sectional structures taken along an A-A' line in FIG. 22(a). For the second manufacturing method, a damascene process is used in a formation of a wiring.

First of all, a first wiring layer 110 including a plurality of signal wirgns 10 having an equal width and a plurality of dummy patterns 101 having an equal width is formed on a semiconductor substrate 80 as shown in FIG. 22(a). At least two of the signal wirings which are adjacent to each other are electrically connected to each other. In FIG. 22, moreover, the dummy pattern takes a square shape and a length of a side of the dummy pattern is equal to a wiring width of the signal wiring 10.

As shown in FIG. 22(b) (which is a sectional view taken along an A-A line in FIG. 22(a)), first of all, an interlayer insulating film 90 is formed on the substrate 80 and a wiring trench 94 for forming the wiring 10 and the dummy pattern 101 is provided on the interlayer insulating film 90. As shown in FIG. 22(c), then, a metal film 95 is formed to fill in the wiring trench 94.

As shown in FIG. 22(d), next, the metal film 95 provided out of the wiring trench 94 is removed by the CMP to form a wiring structure having the wiring 10 and the dummy pattern 101.

In order to evaluate the second method of manufacturing a semiconductor integrated circuit apparatus according to the sixth embodiment, a method of manufacturing a semiconductor integrated circuit apparatus according to the conventional art will be described below with reference to FIG. 32.

The second method of manufacturing a semiconductor integrated circuit apparatus according to the conventional art uses a wide wiring in order to reduce a wiring resistance.

Figures 32A, 32B, 32C, 32D:
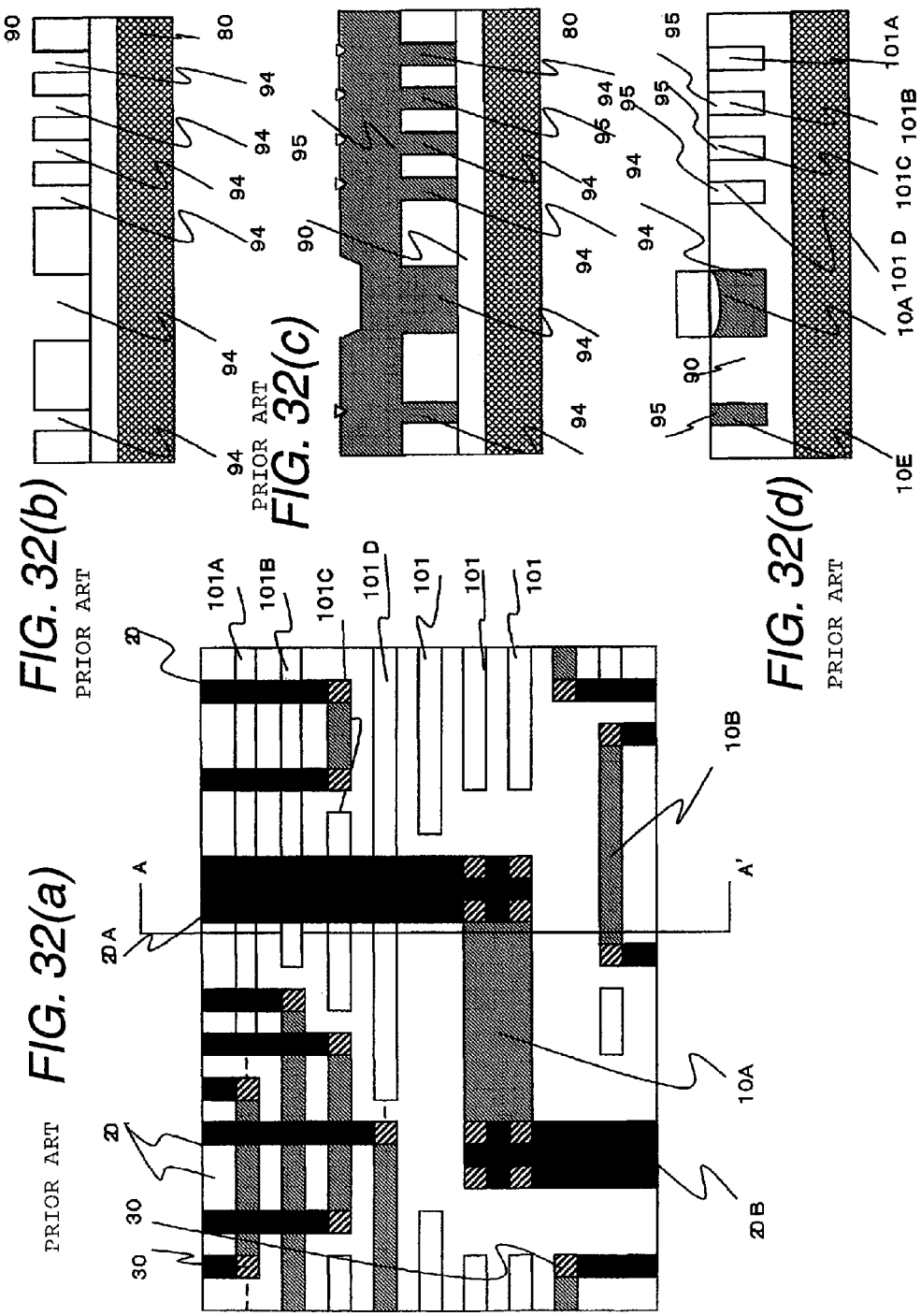
FIG. 32 is a view for explaining the method of manufacturing a semiconductor integrated circuit apparatus according to the conventional art.

FIG. 32(a) is a typical view showing a planar structure of the semiconductor integrated circuit apparatus, illustrating a wiring pattern of a second wiring layer which is superposed on the typical view showing the planar structure of the first wiring layer.

In FIG. 32(a), a wiring pattern 10A of a first wiring layer and wiring patterns 20A and 20B of a second wiring layer are wired by using a wide wiring having a width which is three times as great as a minimum wiring width.

In a design rule, generally, a wiring spacing rule of the wide wiring is greater than a wiring spacing rule of the minimum wiring width. In FIG. 32(a), therefore, an interval between the wide wiring and a surrounding wiring and dummy pattern is great.

In the method of manufacturing a semiconductor integrated circuit apparatus according to the conventional art, as shown in FIG. 32(b), an interlayer insulating film 90 is formed on a substrate 80, and a wiring trench 94 is provided on the interlayer insulating film 90 to form a wiring. Then, a metal film 95 is formed to fill in the wiring trench 94 as shown in FIG. 32(c). As shown in FIG. 32(d), next, the metal film 95 provided out of the wiring trench 94 is removed by CMP to form a wiring.

In the case in which a region having a great wiring width is polished by the CMP, the metal film 96 in the wiring trench 94 is polished excessively in the wide wiring portion. As shown in FIG. 32(c), consequently, there is generated dishing in which the metal film 95 has a greater concave portion in a central part than that on both ends with respect to the insulating film 90. When such dishing is generated, a volume of the metal film is decreased so that a wiring resistance is increased.

Moreover, a concavo-convex portion of an interlayer insulating film formed thereon is generated, which is not shown.

In contrast to these conventional methods, it is possible to reduce the wiring resistance by using at least two adjacent wiring patterns and electrically connecting them to each other to make a wiring without a wide wiring in the second method of manufacturing a semiconductor integrated circuit apparatus according to the sixth embodiment. At the same time, an upper surface of the metal film 95 can be formed to be completely flat.

In the fourth embodiment, the wiring is corrected after the generation of the dummy pattern. In the case in which there is a possibility that a short circuit of the corrected wiring and the dummy pattern might be generated, consequently, it is preferable to carry out a correction, for example, a deletion of the dummy pattern. In the fifth embodiment, finally, the dummy pattern is generated in the empty region. For this reason, it is not necessary to correct the dummy pattern.

In the case in which the first to fifth embodiments are applied to an ASIC design, it is preferable to execute LPE again, thereby trying a timing verification again after a wiring reinforcing step or a wiring correction, while the dummy pattern is expressed in such a shape as to occupy a plurality of girds in the drawings, moreover, the dummy pattern may be provided in only an intersecting portion of the grid lines on the upper and lower layers. Furthermore, an electric potential of the dummy pattern may be floating or a ground electric potential.

The shape of the dummy pattern may be a rectangle or a square. Although a width of the dummy pattern is equal to a signal wiring width, a length of the dummy pattern may be equal to the signal wiring width or not.

In addition, the dummy pattern does not need to be formed in all of the empty regions. For example, it is also possible to prevent the dummy pattern from being generated within a predetermined range from a specific signal line.

While the description has been given to the example in which two adjacent signal wirings are connected to each other over the same layer in the embodiments, furthermore, it is also possible to apply the invention to a structure in which at least three signal wirings are connected to each other over the same layer. Moreover, it is also possible to electrically connect the signal wirings to each other through a via.

In addition, in the semiconductor integrated circuit apparatus, the at least two adjacent signal wirings may be electrically connected to each other at both ends of a section in which the adjacent signal wirings are provided in parallel with each other. Consequently, it is possible to obtain an advantage that resistance in the section in which the adjacent signal wirings are provided in parallel with each other can be reduced.

In the semiconductor integrated circuit apparatus, moreover, the at least two adjacent signal wirings may be electrically connected to each other over the same wiring layer.

In the semiconductor integrated circuit apparatus, furthermore, all of the at least two adjacent signal wirings and the wirings for electrically connecting the adjacent signal wirings may be formed to have an equal width. By the structure, it is possible to obtain an advantage that a large wiring rule to a wide wiring is not applied and a design will not be complex.

As described above, according to the semiconductor integrated circuit apparatus, and the wiring pattern designing method and apparatus in accordance with the invention, it is possible to use an empty region of a wiring for the generation of a dummy pattern as in the conventional art, and furthermore, to use the empty region for a wiring reinforcement. Therefore, the empty region can be utilized effectively. In addition, a design rule related to an existing surrounding wiring pattern in a wiring reinforcement is taken into consideration. Therefore, the existing surrounding wiring pattern is not influenced.

By generating a reinforced wiring pattern taking a uniformity of a wiring pattern into consideration, moreover, it is possible to reduce a wiring resistance and to improve a yield simultaneously with flattening.

What is claimed is:

1. A semiconductor integrated circuit apparatus wherein a first wiring layer is provided with a plurality of first signal wirings having an equal width which are disposed in parallel with each other at a regular interval in a horizontal direction in a view showing a planar structure,
    at least two of the plurality of first signal wirings, which are adjacent to each other, are electrically connected to each other by at least two second signal wirings, said at least two second signal wirings extending in a vertical direction in a view showing a planar structure,
    the at least two first signal wirings and the at least two second signal wirings are disposed in the same wiring layer,
    at least one of a third signal wiring, which is provided in a different wiring layer from the first wiring layer, is electrically connected to at least one of the first signal wirings, said at least one of the third signal wiring extending in a vertical direction in a view showing a planar structure,
    at least one of a fourth signal wiring, which is provided in a different wiring layer from the first wiring layer, is electrically connected to at least one of the first signal wirings, said at least one of the fourth signal wiring extending in a vertical direction in a view showing a planar structure, and
    said at least one of the third signal wiring and said at least one of the fourth signal wiring are connected to at least one of the first signal wirings at a different point.

2. The semiconductor integrated circuit apparatus according to claim 1, wherein the at least two adjacent signal wirings are electrically connected to each other in a plurality of portions.

3. The semiconductor integrated circuit apparatus according to claim 2, wherein the at least two adjacent signal wirings are electrically connected to each other at both ends of a section in which the adjacent signal wirings are provided in parallel with each other.

4. The semiconductor integrated circuit apparatus according to claim 2, wherein the at least two adjacent signal wirings are electrically connected to each other over the same wiring layer.

5. The semiconductor integrated circuit apparatus according to claim 2, wherein all of the at least two adjacent signal wirings and the at least two second signal wirings for electrically connecting the adjacent signal wirings have an equal width.

6. The semiconductor integrated circuit apparatus according to claim 1, wherein said at least two second signal wirings are not connected to one another in said same wiring layer.

7. A semiconductor integrated circuit apparatus wherein a first wiring layer is provided with a plurality of first signal wirings and dummy patterns which have equal widths and are disposed in parallel with each other at regular intervals and in a horizontal direction in a view showing a planar structure,
    at least two of the plurality of first signal wirings which are adjacent to each other are electrically connected to each other by at least two second signal wirings, said at least two second signal wirings extending in a vertical direction in a view showing a planar structure,
    the at least two first signal wirings and the at least two second signal wirings are disposed in the same wiring layer,
    at least one of a third signal wiring, which is provided in a different wiring layer from the first wiring layer, is electrically connected to at least one of the first signal wirings, said at least one of the third signal wiring extending in a vertical direction in a view showing a planar structure,
    at least one of a fourth signal wiring, which is provided in a different wiring layer from the first wiring layer, is electrically connected to at least one of the first signal wirings, said at least one of the fourth signal wiring extending in a vertical direction in a view showing a planar structure, and
    said at least one of the third signal wiring and said at least one of the fourth signal wiring are connected to at least one of the first signal wirings at a different point.

8. The semiconductor integrated circuit apparatus according to claim 7, wherein the at least two adjacent signal wirings are electrically connected to each other in a plurality of portions.

9. The semiconductor integrated circuit apparatus according to claim 8, wherein the at least two adjacent signal wirings are electrically connected to each other at both ends of a section in which the adjacent signal wirings are provided in parallel with each other.

10. The semiconductor integrated circuit apparatus according to claim 8, wherein the at least two adjacent signal wirings are electrically connected to each other over the same wiring layer.

11. The semiconductor integrated circuit apparatus according to claim 8, wherein all of the at least two adjacent signal wirings and the at least two second signal wirings for electrically connecting the adjacent signal wirings have an equal width.

12. The semiconductor integrated circuit apparatus according to claim 7, wherein said at least two second signal wirings are not connected to one another in said same wiring layer.

13. A semiconductor integrated circuit apparatus comprising:
- a first wiring group in which a first wiring layer is provided with a plurality of first signal wirings having an equal width which are disposed in parallel with each other at a regular interval,
- wherein at least two of the first signal wirings provided in the first wiring layer, which are adjacent to each other, are electrically connected to each other, said first signal wirings provided in the first wiring layer extending in a horizontal direction in a view showing a planar structure;
- a second wiring group in which a second wiring layer is provided with a plurality of second signal wirings having an equal width which are disposed in parallel with each other at a regular interval,
- at least two of the second signal wirings provided in the second wiring layer, which are adjacent to each other, are electrically connected to each other, said second signal wirings provided in the second wiring layer extending in a vertical direction in a view showing a planar structure,
- the first wiring group and the second wiring group are electrically connected to each other through a via,
- the at least two first signal wirings and the at least two second signal wirings are disposed in the same wiring layer,
- at least one of a third signal wiring, which is provided in a different wiring layer from the first wiring layer, is electrically connected to at least one of the first signal wirings, said at least one of the third signal wiring extending in a vertical direction in a view showing a planar structure,
- at least one of a fourth signal wiring, which is provided in a different wiring layer from the first wiring layer, is electrically connected to at least one of the first signal wirings, said at least one of the fourth signal wiring extending in a vertical direction in a view showing a planar structure, and
- said at least one of the third signal wiring and said at least one of the fourth signal wiring are connected to at least one of the first signal wirings at a different point.

14. The semiconductor integrated circuit apparatus according to claim 13, wherein the at least two adjacent first signal wirings of the first wiring group are electrically connected to each other in a plurality of portions.

15. The semiconductor integrated circuit apparatus according to claim 14, wherein the at least two adjacent first signal wirings of the first wiring group are electrically connected to each other at both ends of a section in which the first adjacent signal wirings of the first wiring group are provided in parallel with each other.

16. The semiconductor integrated circuit apparatus according to claim 14, wherein the at least two adjacent first signal wirings of the first wiring group are electrically connected to each other over the same wiring layer.

17. The semiconductor integrated circuit apparatus according to claim 14, wherein all of the at least two adjacent first signal wirings of the first wiring group and the at least two second signal wirings for electrically connecting the adjacent first signal wirings have an equal width.

* * * * *